United States Patent
Kawashima et al.

(10) Patent No.: US 8,258,561 B2
(45) Date of Patent: Sep. 4, 2012

(54) SEMICONDUCTOR DEVICE AND A METHOD OF MANUFACTURING THE SAME

(75) Inventors: Yoshiyuki Kawashima, Tokyo (JP); Koichi Toba, Tokyo (JP); Yasushi Ishii, Tokyo (JP); Toshikazu Matsui, Tokyo (JP); Takashi Hashimoto, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/307,424

(22) Filed: Nov. 30, 2011

(65) Prior Publication Data
US 2012/0068307 A1   Mar. 22, 2012

Related U.S. Application Data

(62) Division of application No. 12/239,807, filed on Sep. 28, 2008, now Pat. No. 8,084,800.

(30) Foreign Application Priority Data

Oct. 15, 2007  (JP) .................................. 2007-267398

(51) Int. Cl.
*H01L 27/08* (2006.01)

(52) U.S. Cl. ................. 257/296; 257/532; 257/E27.048

(58) Field of Classification Search .................... 257/296
See application file for complete search history.

(56) References Cited

U.S. PATENT DOCUMENTS

| | | | |
|---|---|---|---|
| 6,559,496 B2 | 5/2003 | Okuda | |
| 2002/0040988 A1 | 4/2002 | Hidaka et al. | |
| 2002/0070402 A1 | 6/2002 | Ichige et al. | |
| 2003/0057466 A1* | 3/2003 | Otsuki | 257/296 |
| 2003/0071297 A1 | 4/2003 | Hara et al. | |
| 2006/0034142 A1* | 2/2006 | Ooishi et al. | 365/230.06 |

FOREIGN PATENT DOCUMENTS

| | | |
|---|---|---|
| JP | 2002-313932 A | 10/2002 |
| JP | 2003-124356 A | 4/2003 |
| JP | 2003-100887 A | 4/2004 |

* cited by examiner

*Primary Examiner* — Jarrett Stark
*Assistant Examiner* — Lawrence Tynes, Jr.
(74) *Attorney, Agent, or Firm* — Miles & Stockbridge P.C.

(57) ABSTRACT

In connection with a semiconductor device including a capacitor element there is provided a technique capable of improving the reliability of the capacitor element. A capacitor element is formed in an element isolation region formed over a semiconductor substrate. The capacitor element includes a lower electrode and an upper electrode formed over the lower electrode through a capacitor insulating film. Basically, the lower electrode and the upper electrode are formed from polysilicon films and a cobalt silicide film formed over the surfaces of the polysilicon films. End portions of the cobalt silicide film formed over the upper electrode are spaced apart a distance from end portions of the upper electrode. Besides, end portions of the cobalt silicide film formed over the lower electrode are spaced apart a distance from boundaries between the upper electrode and the lower electrode.

4 Claims, 27 Drawing Sheets

SEMICONDUCTOR DEVICE AND A METHOD OF MANUFACTURING THE SAME

CROSS-REFERENCE TO RELATED APPLICATIONS

This application is a division of application Ser. No. 12/239,807 filed Sep. 28, 2008 now U.S. Pat. No. 8,084,800. Also, the disclosure of Japanese Patent Application No. 2007-267398 filed on Oct. 15, 2007 including the specification, drawings and abstract is incorporated herein by reference in its entirety.

BACKGROUND OF THE INVENTION

The present invention relates to a semiconductor device and a manufacturing technique for the same. Particularly, the present invention is concerned with a semiconductor device having a capacitor element and a technique applicable effectively to the manufacture of the semiconductor device.

In Japanese Unexamined Patent Publication No. 2003-100887 (Patent Literature 1) there is described a technique for improving the reliability of an upper-layer electrode/lower-Layer electrode structure formed with an insulating film therebetween. More particularly, a lower-layer electrode and an upper-layer electrode are stacked in this order on a silicon substrate. In this case, a contact hole for the upper-layer electrode, which hole is for coupling the upper-layer electrode to an overlying wiring layer, is formed in a region positioned above an isolation region which is formed separately from the lower-layer electrode.

In Japanese Unexamined Patent Publication No. 2003-124356 (Patent Literature 2) there is described a technique related to a semiconductor device such as a flash memory having a capacitor element used for example in a charge pump circuit, whereby an increase of chip area is suppressed, the capacitance of the capacitor element can be set highly accurately, and the number of manufacturing steps can be reduced. More particularly, on a field oxide film there is formed a lower electrode of the capacitor element under self-aligning with a trench portion. By so doing, according to Patent Literature 2, the lower electrode and a floating gate electrode in a memory cell portion can be formed simultaneously in the same process. The lower electrode is enclosed with a trench portion formed in a field oxide film. An upper electrode formed in the same process as a control gate electrode is formed on the lower electrode through an insulating film formed in the same process as a gate-to-gate insulating film in the memory cell portion. In this technique, the upper electrode is extended to the exterior of the lower electrode and in this extended region there is formed a plug coupled to the upper electrode.

In Japanese Unexamined Patent Publication No. 2002-313932 (Patent Literature 3) there is described, in connection with a semiconductor device having a capacitor element, a technique for preventing the occurrence of short-circuit caused by silicide and leak current in side wall portions formed on side portions of a capacitor electrode. More particularly, a lower capacitor electrode, a capacitor insulating film and an upper capacitor electrode are formed on an element isolation region of a silicon substrate. Thereafter, a silicon oxide film is formed on the whole of an upper surface of the silicon substrate. Onto this silicon oxide film is then formed a resist pattern which covers from a certain range inside an edge portion of the upper capacitor electrode up to a certain range outside the edge portion. Then, anisotropic etching is performed to form side walls which cover side faces of the lower capacitor electrode and side walls which cover side faces and an edge portion of an upper surface of the upper capacitor electrode. Thereafter, a metal silicide film is formed on surfaces of the upper and lower capacitor electrodes not covered with the side walls.

PATENT LITERATURES

1. Japanese Unexamined Patent Publication No. 2003-100887
2. Japanese Unexamined Patent Publication No. 2003-124356
3. Japanese Unexamined Patent Publication No. 2002-313932

SUMMARY OF THE INVENTION

There is a semiconductor device wherein a microcomputer is formed on one semiconductor chip. On the semiconductor chip with a microcomputer formed thereon there are formed a central processing unit (CPU) comprised of a logic circuit such as a CMISFET (Complementary Metal Insulator Semiconductor Field Effect Transistor), as well as a memory and an analog circuit.

As the memory formed on the semiconductor chip there is used, for example, an electrically rewritable non-volatile memory. EEPROM (Electrically Erasable and Programmable Read Only Memory) and flash memory are in wide use as electrically writable and erasable non-volatile memories. These non-volatile memories typified by EEPROM and flash memory which are in wide use now, have a charge storage film such as an electrically conductive floating gate electrode or a trapping insulating film, surrounded with a silicon oxide film, below a gate electrode of MOS (Metal Oxide Semiconductor). Information is stored by utilizing the fact that the threshold value of transistor differs depending on the state of charge storage of the floating gate electrode or the trapping insulating film.

The trapping insulating film represents an insulating film having a trap level capable of storing an electric charge. An example thereof is a silicon nitride film. By injection and release of an electric charge to and from the trapping insulating film the threshold value of MOS transistor is shifted, allowing the transistor to operate as a storage element. A non-volatile memory using a trapping insulating film as a charge storage film is called a MONOS (Metal Oxide Nitride Oxide Semiconductor) type transistor. This transistor is superior in the reliability of data hold because an electric charge is stored in a discrete trap level, as compared with the case where an electrically conductive floating gate electrode is used as the charge storage film. Moreover, because of the excellent data hold reliability, the silicon oxide films overlying and underlying the trapping insulating film can be made thin, thus making it possible to lower the voltage in write and erase operations.

For operating such a non-volatile memory as described above, a drive circuit such as a booster circuit is formed in the semiconductor chip. A highly accurate capacitor element is considered necessary for the drive circuit. In the semiconductor chip with a microcomputer formed thereon there also is formed an analog circuit. A highly accurate capacitor element is considered necessary also for the analog circuit. Thus, in the semiconductor chip there also is formed a capacitor element in addition to the foregoing non-volatile memory and MISFET.

The capacitor element is formed for example in a wiring layer. More particularly, there is known a structure wherein an insulating film present between wiring layers is used as a capacitor insulating film and upper and lower electrodes are formed by a metal film used in wiring. For example, this capacitor element is called MIM (Metal Insulator Metal) capacitor element. According to the MIM capacitor element I is possible to form a highly accurate capacitor element because the metal film for wiring is used for both upper and lower electrodes.

However, the formation of MIM capacitor requires an additional process for forming the same capacitor, thus giving rise to the problem that the cost of the semiconductor device increases. In view of this point there has been proposed a technique of forming the capacitor element on a semiconductor substrate.

For example, in a non-volatile memory cell, a control gate electrode is formed on a semiconductor substrate through a gate insulating film, and on one side wall of the control gate electrode is formed a side wall-like memory gate electrode through a laminate film. It is conducted to use such a non-volatile memory cell manufacturing process and form a capacitor element simultaneously with the memory cell. More particularly, a lower electrode of the capacitor element is formed in the process of forming the control gate electrode of the non-volatile memory cell and a capacitor insulating film of the capacitor element is formed in the process of forming a laminate film including a charge storage film of the non-volatile memory. Further, an upper electrode of the capacitor element is formed in the process of forming the memory gate electrode of the non-volatile memory cell. In this way the capacitor element can be formed in the non-volatile memory cell forming process and therefore the capacitor element can be formed on a semiconductor substrate without the addition of any new process for forming the capacitor element. Thus, even if the capacitor element is formed on the semiconductor substrate, it is possible to prevent a rise in manufacturing cost of the semiconductor device. This capacitor element is called PIP (Polysilicon Insulator Polysilicon) capacitor element because a polysilicon film is used for each of upper and lower electrodes.

For example, as noted above, since the PIP capacitor element is used for a booster circuit or an analog circuit, a relatively high voltage is applied to the upper and lower electrodes as components of the PIP capacitor element. Therefore, the PIP capacitor element is required to be high in reliability so as to operate normally with high accuracy even when a high voltage is applied thereto.

FIG. 25 is a plan view showing a PIP capacitor element C which the present inventors have studied. As shown in the same figure, a lower electrode 109 and an upper electrode 110 have respective rectangular shapes different from each other and have a mutually planarly overlapping region and planarly non-overlapping regions. That is, in FIG. 25, the length of the lower electrode 109 is larger than that of the upper electrode 110 in x direction, while in y direction the length of the lower electrode 109 is smaller than that of the upper electrode 110. The PIP capacitor element C is formed in the planarly overlapping region of both upper and lower electrodes 109, 110. In the non-overlapping regions of the lower electrode 109 there are formed plugs 114 coupled electrically to the lower electrode 109. Likewise, in the non-overlapping regions of the upper electrode 110 there are formed plugs 115 coupled electrically to the upper electrode 110. By forming the plugs 115 coupled to the upper electrode 110 in the non-overlapping region of the upper electrode 110 it is possible to improve the reliability of the PIP capacitor element C. For example, in the case of a shape in which the upper electrode is planarly included in the lower electrode, there exists only a planarly overlapping region between the upper and lower electrodes. It follows that the plugs coupled electrically to the upper electrode are formed on the overlapping region. That is, the plugs coupled to the upper electrode are formed on the PIP capacitor element formed in the overlapping region. In this case, formation of the plugs coupled to the upper electrode may result in damage to a capacitor insulating film which is in contact with the bottoms of the plugs. Since the capacitor insulating film possesses an important role in the characteristics of the PIP capacitor element, damage thereof would lead to deterioration in characteristics of the PIP capacitor element.

To avoid such an inconvenience, as shown in FIG. 25, the upper electrode 110 and the lower electrode 109 are formed in different rectangular shapes to permit formation of both overlapping region and non-overlapping regions. The overlapping region serves as the PIP capacitor element C and the non-overlapping regions of the upper electrode 110 serve as lead-out regions of the upper electrode 110. By forming the plugs 115 coupled to the upper electrode 110 in the lead-out regions formed in the non-overlapping regions it is possible to prevent damage to the capacitor insulating film of the PIP capacitor element C formed in the overlapping region. That is, since the PIP capacitor element C is not formed in the non-overlapping regions (lead-out regions) of the upper electrode 110, there arises no problem in characteristics of the PIP capacitor element even if the plugs 115 are formed in the non-overlapping regions. For this reason there is used such a PIP capacitor element C as shown in FIG. 25 which is of a structure having an overlapping region and non-overlapping regions.

With this PIP capacitor element C, however, the following problem is being actualized. A description will be given about this problem. FIG. 26 is a sectional view taken on line A-A in FIG. 25. As shown in the same figure, an element isolation region 101 is formed in a semiconductor substrate 100 and a PIP capacitor element is formed on the element isolation region 101. More specifically, a lower electrode 109 is formed on the element isolation region 101 and a capacitor insulating film 106 comprised of a silicon oxide film 103, a silicon nitride film 104 and a silicon oxide film 105 is formed on the lower electrode 109, further, an upper electrode 110 is formed on the capacitor insulating film 106. The PIP capacitor element thus comprised of the lower electrode 109, the capacitor insulating film 106 and the upper electrode 110 is covered with an insulating film 113 which serves an interlayer insulating film, and there are formed plugs 114 extending through the insulating film 113 and reaching the lower electrode 109. The plugs 114 are formed in non-overlapping regions of the lower electrode 109.

The lower electrode 109 is comprised of a polysilicon film 102 and a metal silicide film (e.g., cobalt silicide film) 108 formed on a surface of the polysilicon film 102. The metal silicide film 108 is formed in regions not planarly overlapping the upper electrode 110. Further, side walls 112 comprised of an insulating film is formed at end portions of the lower electrode 109.

The upper electrode 110 is comprised of a polysilicon film 107 and a metal silicide film (e.g., cobalt silicide film) 108 formed on a surface of the polysilicon film 107. Further, side walls 111 are formed at end portions of the upper electrode 110.

The metal silicide film 108 can be formed on the surface of the polysilicon film 107 as a constituent of the upper electrode 110 and also on the surface of the polysilicon film 102 as a constituent of the lower electrode 109 by depositing a metal film in contact with the polysilicon films 107 and 102 which are exposed and subsequent heat treatment, allowing a silicide reaction to take place between the metal film and the polysilicon film 107 (102). At this time, the metal silicide film may grow to an abnormal extent. Particularly, if the metal silicide film 108 grows to an abnormal extent at end portions of the upper electrode 110, as shown in FIG. 26, the metal silicide film 108 creeps up the side walls 111 from the end portions of the upper electrode 110 and there occurs connection thereof with the metal silicide film 108 formed on the surface of the lower electrode 109. As a result, the upper electrode 110 and the lower electrode 109 are coupled together electrically through the metal silicide film 108, causing a short-circuit defect. Upon occurrence of a short-circuit defect, the PIP capacitor element no longer operates normally, thus giving rise to the problem that the reliability of the PIP capacitor element is deteriorated. Particularly, as the polysilicon film 107 as a constituent of the upper electrode 110 becomes thin and the distance between the lower electrode 109 and the upper electrode 110 becomes short, the short-circuit defect caused by the abnormal growth of the metal silicide film 108 becomes conspicuous.

There sometimes is a case where the PIP capacitor element formed on the semiconductor substrate is manufactured by an independent manufacturing process, but usually, for simplification of the semiconductor device manufacturing process, the PIP capacitor element is formed in the process of forming a non-volatile memory cell.

Recently, the non-volatile memory cell formed in the same process as the PIP capacitor element has been becoming more and more fine. This means that the gate length of a gate electrode (especially a memory gate electrode) of the non-volatile memory cell becomes smaller. For microminiaturizing the gate length of the memory gate electrode, the thickness of the polysilicon film which configures the memory gate electrode tends to become smaller. That is, the memory gate electrode is formed on each side wall of a control gate electrode, but for shortening the gate length of the memory gate electrode it is necessary to thin the polysilicon film which is formed so as to cover the control gate electrode. By forming the polysilicon film thin it is possible to narrow the width of the memory gate electrode which is formed on each side wall of the control gate electrode by anisotropic etching. More particularly, the width of the memory gate electrode formed on each side wall of the control gate electrode depends on the thickness of deposited polysilicon film. This means that the thinner the thickness of the polysilicon film which configures the memory gate electrode, the thinner the film of the upper electrode as a constituent of the PIP capacitor element. This is because the upper electrode as a constituent of the PIP capacitor element is formed by the same film as the polysilicon film which configures the memory gate electrode.

Accordingly, with respect to the PIP capacitor element formed in the same process as the non-volatile memory cell, the polysilicon film which configures the upper electrode is becoming more and more thin, and particularly a short-circuit defect caused by abnormal growth of a metal silicide film is becoming conspicuous as a problem. Thus, it is seen that in the case of the PIP capacitor element including an overlapping region and non-overlapping regions as upper electrode-forming regions, a short-circuit defect caused by abnormal growth of a metal silicide film poses a problem, and particularly in the case of the PIP capacitor element formed in the same process as the non-volatile memory cell there arises a serious problem because the film thickness of the upper electrode becomes smaller.

Further, in the PIP capacitor element including an overlapping region and non-overlapping regions as upper electrode-forming regions, there also exists the following problem in addition to the above short-circuit problem. FIG. 27 is a sectional view taken on line B-B in FIG. 25. As shown in FIG. 27, an element isolation region 101 is formed in the semiconductor substrate 100 and the PIP capacitor element is formed on the element isolation region 101. The PIP capacitor element has a lower electrode 109 on the element isolation region 101 and a capacitor insulating film 106 is formed so as to cover the lower electrode 109. The capacitor insulating film 106 is comprised of silicon oxide film 103, silicon nitride film 104 and silicon oxide film 105. An upper electrode 110 is formed on the capacitor insulating film 106. In this B-B section, the length of the upper electrode 110 is larger than that of the lower electrode 109, so that there occur stepped regions in the upper electrode 110. That is, in the upper electrode 110 there exist an overlapping region which covers the lower electrode 109 as an underlying layer and non-overlapping regions (lead-out regions) free of any underlying lower electrode 109, thus inevitably creating stepped regions between the overlapping region and the non-overlapping regions. An insulating film 113 serving as an interlayer insulating film is formed on the upper electrode 110 and plugs 115 are formed in the insulating film 113, the plugs 115 extending through the insulating film 113 and reaching the upper electrode 110. The plugs 115 are coupled to the non-overlapping regions of the upper electrode 110. Further, side walls 112 are formed at end portions of the upper electrode 110 and side walls 111 are formed also in the stepped regions which are formed in boundary regions between the overlapping region and the non-overlapping regions of the upper electrode 110.

As shown in FIG. 27, the upper electrode 110 is comprised of a polysilicon film 107 and a metal silicide film 108 formed on the surface of the polysilicon film 107. The metal silicide film 108 is formed by siliciding the polysilicon film 107. This silicidation is promoted at upper end portions of the stepped regions (boundary regions between the overlapping region and the non-overlapping regions) of the upper electrode 110. This is for the following reason. The side walls 111 are formed on side walls of the stepped regions, but at the upper end portions of the stepped regions the side walls 111 are removed easily and the polysilicon film is exposed. That is, at the upper end portions of the stepped regions, silicidation proceeds in both horizontal and vertical directions and therefore the metal silicide film 108 becomes thicker in comparison with the other regions. Consequently, at the upper end portions of the stepped regions, the distance between the metal silicide film 108 and the capacitor insulating film 106 becomes short and the metal silicide film 108 becomes thick, so that field concentration is apt to occur. Thus, at the upper end portions of the stepped regions, dielectric breakdown is apt to occur under the influence of the field concentration and the influence of the shortened distance between the metal silicide film 108 and he capacitor insulating film 106. Once dielectric breakdown of the capacitor insulating film 106 occurs, the PIP capacitor element does not operate normally, giving rise to the problem that the reliability of the PIP capacitor element is deteriorated. This problem can also be considered to be become more marked as the polysilicon film which configures the upper electrode 110 becomes thinner, thus posing a serious problem for the PIP capacitor element formed in the same process as the non-volatile memory cell.

It is an object of the present invention to provide a technique capable of improving the reliability of a capacitor element in a semiconductor device including the capacitor element.

The above and other objects and novel features of the present invention will become apparent from the following description and the accompanying drawings.

The following is an outline of typical modes of the present invention as disclosed herein.

A semiconductor device according to a typical mode of the present invention comprises (a) a semiconductor substrate, (b) an element isolation region formed over the semiconductor substrate, and (c) a capacitor element formed over the element isolation region, the capacitor element including (c1) a lower electrode formed over the element isolation region, (c2) a capacitor insulating film formed over the lower electrode and (c) an upper electrode formed over the capacitor insulating film, wherein the length of the upper electrode in a first direction is larger than that of the lower electrode in the first direction, the length of the upper electrode in a second direction intersecting the first direction is smaller than that of the lower electrode in the second direction, the capacitor element is formed in a region (overlapping region) where the upper electrode and the lower electrode overlap each other planarly, and over a surface of the upper electrode there exist a region where a metal silicide film is formed and a region where the metal silicide film is not formed, the metal silicide film-formed region comprising a region spaced apart from end regions of the upper electrode in the second direction and a region spaced apart from stepped regions of the upper electrode in the first direction.

According to the above typical mode of the present invention, in the upper electrode, the regions where the metal silicide film is formed are limited to the region spaced apart from end regions of the upper electrode in the second direction and the region spaced apart from stepped regions of the upper electrode in the first direction. Consequently, it is possible to suppress the occurrence of a short-circuit defect caused by creeping-up of the metal silicide film from end regions of the upper electrode and reaching the surface of the lower electrode and also possible to suppress dielectric breakdown of the capacitor insulating film caused by field concentration in stepped regions of the upper electrode.

A method for manufacturing a semiconductor device according to another typical mode of the present invention comprises the steps of (a) forming an element isolation region over a semiconductor substrate and (b) forming a capacitor element over the element isolation region, the step (b) including the steps of (b1) forming a lower electrode over the element isolation region, (b2) forming a capacitor insulating film over the lower electrode and (b3) forming an upper electrode over the capacitor insulating film, the lower electrode and the upper electrode being formed in such a manner that the length of the upper electrode in a first direction is larger than that of the lower electrode in the first direction and the length of the upper electrode in a second direction intersecting the first direction is smaller than that of the lower electrode in the second direction, the capacitor element being formed in an planarly overlapping region of the upper electrode and the lower electrode, the step (b) further including the steps of (b4), after the step (b3), forming an insulating film over the upper electrode, (b5) patterning the insulating film to cover with the insulating film predetermined regions including end regions of the upper electrode in the second direction and predetermined regions including stepped regions of the upper electrode in the first direction, and then (b6), after the step (b5), forming a metal silicide film over a surface of the upper electrode, the metal silicide film formed over the surface of the upper electrode being formed in a region spaced apart from the end regions of the upper electrode in the second direction and also formed in a region spaced apart from the stepped regions of the upper electrode in the first direction.

Thus, according to another typical mode of the present invention, in the upper electrode, a metal silicide film is not formed in end regions of the upper electrode in the second direction and stepped regions of the upper electrode in the first direction. Therefore, it is possible to suppress the occurrence of a short-circuit defect caused by creeping-up of the metal silicide film from the end regions of the upper electrode and also suppress the occurrence of dielectric breakdown of the capacitor insulating film caused by field concentration in the stepped regions of the upper electrode.

The following is a brief description of effect obtained by the typical modes of the present invention as disclosed herein.

According to the above typical modes of the present invention, in the PIP capacitor element wherein the upper electrode-forming region includes an overlapping region overlapping with the lower electrode planarly and non-overlapping regions not overlapping with the lower electrode, the regions of the metal silicide film formed over the upper electrode are limited to a region spaced apart from end regions of the upper electrode and a region spaced apart from stepped regions of the upper electrode. Consequently, it is possible to suppress the occurrence of a short-circuit defect caused by creeping up of the metal silicide film from end regions of the upper electrode and reaching the surface of the lower electrode and also possible to suppress dielectric breakdown of the capacitor insulating film caused by field concentration at stepped regions of the upper electrode.

DETAILED DESCRIPTION OF THE PREFERRED EMBODIMENTS

Figure 1:
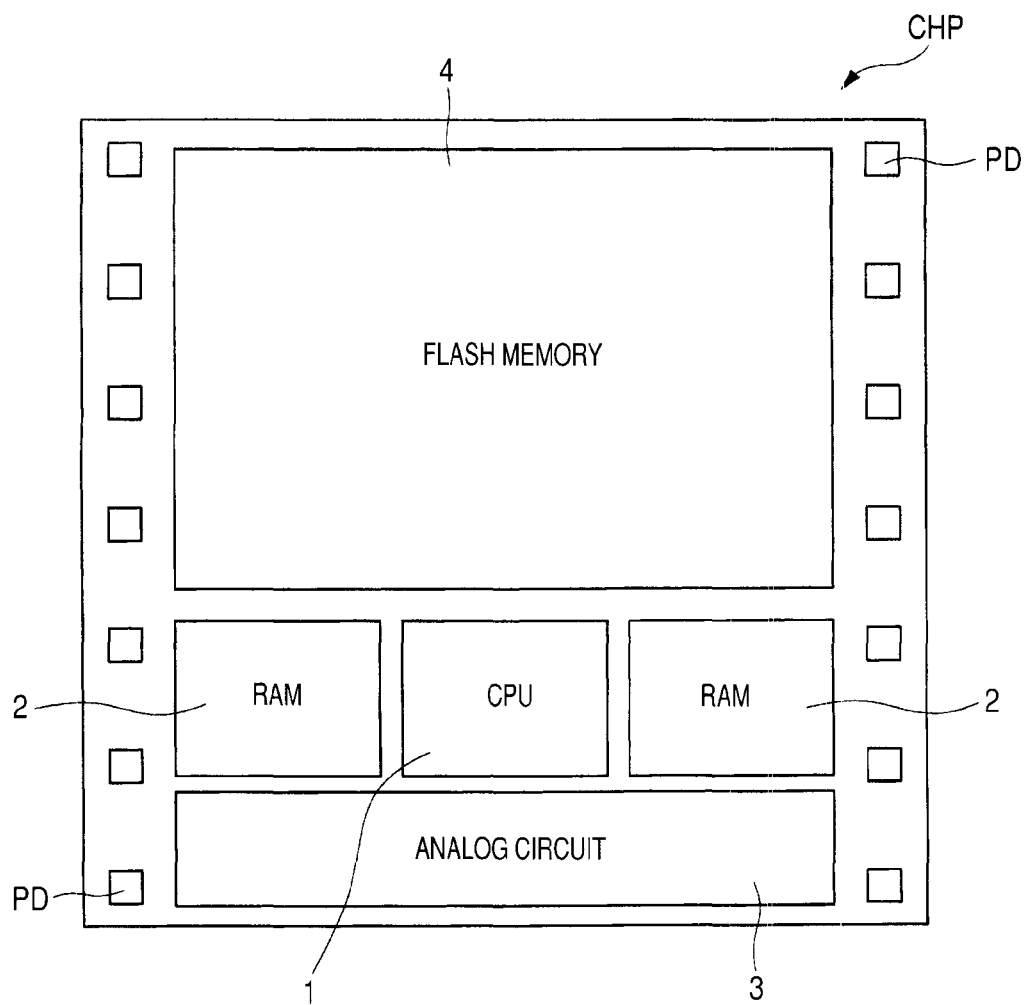
FIG. 1 is a diagram showing a layout configuration of a semiconductor chip.

The following embodiments will each be described dividedly into plural sections or embodiments where required for the sake of convenience, but unless otherwise mentioned, they are not unrelated to each other, but one is in a relation of modification or detailed or supplementary explanation of part or the whole of the other.

When reference is made to, for example, the number of elements (including the number of pieces, numerical value, quantity, and range) in the following embodiments, no limitation is made to the specified number, but numbers above and below the specified number will do unless otherwise mentioned and except the case where limitation is made to the specified number basically clearly.

In the following embodiments, moreover, it goes without saying that their constituent elements (including constituent steps) are not always essential unless otherwise mentioned and except the case where they are considered essential basically clearly.

Likewise, in the following embodiments, it is to be understood that when reference is made to the shape and positional relation of a constituent element, those substantially similar or closely similar thereto are also included unless otherwise mentioned and except the case where the answer is negative basically clearly. This is also true of the foregoing numerical value and range.

In all of the drawings for illustrating the embodiments, the same portions are identified by the same reference numerals, and repeated explanations thereof will be omitted, in principle. Even plan views may be hatched to make them easier to see.

First Embodiment

FIG. 1 is a plan view showing a semiconductor chip (semiconductor substrate) CHP with a microcomputer formed thereon for example. A layout configuration of elements formed on the semiconductor chip CHP is shown in the same figure. In FIG. 1, the semiconductor chip CHP includes a CPU (Central Processing Unit) 1, a RAM (Random Access Memory) 2, an analog circuit 3 and a flash memory 4. In the peripheral portion of the semiconductor chip there are formed pads PD as external terminals for input and output to provide coupling between the above circuits and external circuits.

The CPU (circuit) 1, which is also called central processing unit, corresponds to the nucleus of a computer. The CPU 1 reads instructions from a storage device, then decodes them and performs various calculations and controls on the basis of the decoded instructions. The CPU 1 is required to be high in processing speed. Therefore, it is considered that a relatively larger current drive force is required of the MISFET (Metal Insulator Semiconductor Field Effect Transistor) among the elements formed in the semiconductor chip CHP. That is, the MISFET is a low voltage-proof MISFET.

The RAM (circuit) 2 is a memory which can read stored information randomly, or at any time, and newly write information. It is also called a random access memory. There are two types of RAMs as IC memories, which are DRAM (Dynamic RAM) using a dynamic circuit and SRAM (Static RAM) using a static circuit. DRAM is a random access memory requiring a storage holding operation, while SRAM is a random access memory not requiring a storage holding operation. Since the RAM 2 is also required to be high in operation speed, it is considered that a relatively large current drive force is required of the MISFET which configures the RAM 2. That is, the MISFET in question is a low voltage-proof MISFET.

The analog circuit 3 is a circuit which handles timewise continuously changing voltage and current signals, i.e., analog signals, and for example it is comprised of an amplifier circuit, a converter circuit, a modulator circuit, an oscillator circuit and a power supply circuit. As the analog circuit 3 there is used a relatively high voltage-proof MISFET among the elements formed in the semiconductor chip CHP.

The flash memory 4 is a kind of non-volatile memory permitting electrical rewrite of both write and erase operations. It is also called an electrically erasable programmable read-only memory. The memory cell of the flash memory 4 is comprised of MISFET for memory selection and for example a MONOS (Metal Oxide Nitride Oxide Semiconductor) type FET for memory. For write operation of the flash memory there is utilized, for example, hot electron injection or Fowler-Nordheim tunnel phenomenon and for erase operation of the flash memory there is utilized Fowler-Nordheim tunnel phenomenon or hot hole injection. It goes without saying that the hot electron injection and the hot hole injection may be reversed.

A drive circuit such as a booster circuit is formed in the semiconductor chip for operating the flash memory described above. A highly accurate capacitor element is required of the drive circuit. Also for the analog circuit 3 described above, a highly accurate capacitor element is required. Thus, not only the flash memory 4, memory cells and MISFETs, but also a capacitor element is formed in the semiconductor chip CHP. In this first embodiment, one feature resides in the capacitor element formed in the semiconductor chip CHP. The following description is provided about the configuration of the capacitor element formed in the semiconductor chip CHP.

Figure 2:
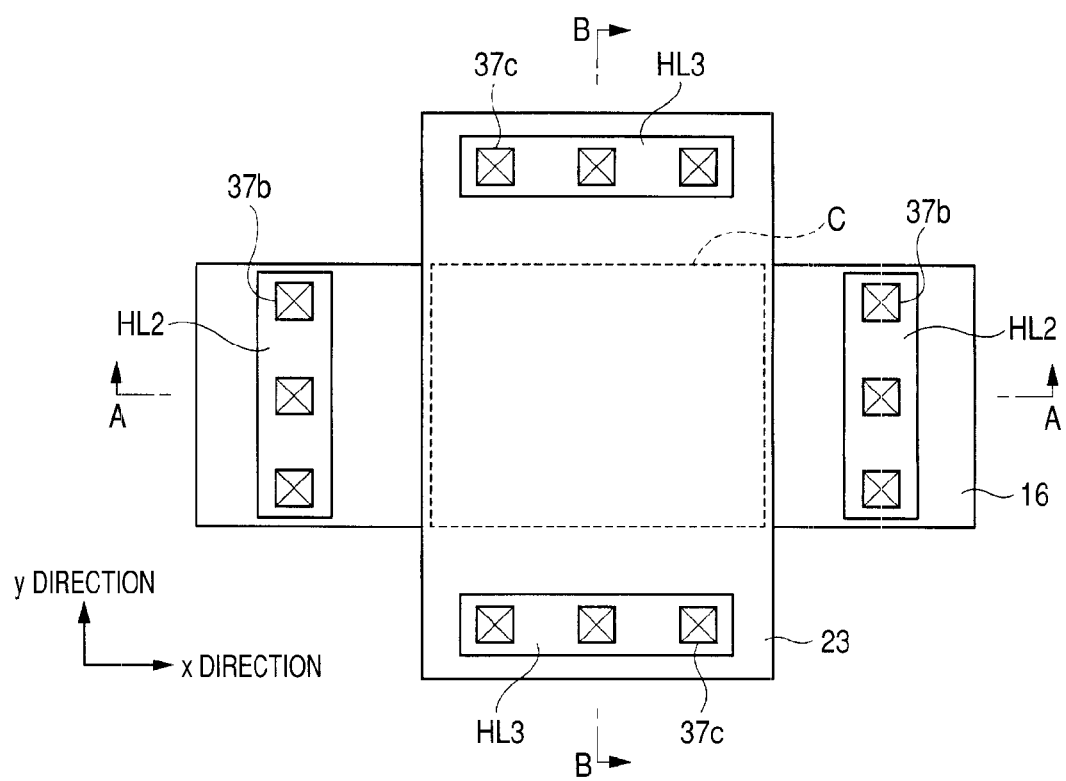
FIG. 2 is a plan view showing the configuration of a capacitor element in a first embodiment of the present invention.

FIG. 2 is a plan view showing a PIP capacitor element C used in this first embodiment. As shown in the same figure, a lower electrode 16 and an upper electrode 23 are of rectangular shapes different from each other, having a planarly overlapping region of both lower and upper electrodes 16, 23 and planarly non-overlapping regions of the two. More specifically, as shown in FIG. 2, the length of the lower electrode 16 is larger than that of the upper electrode 23 in x direction, while in y direction (direction intersecting the x direction) the length of the lower electrode 16 is smaller than that of the upper electrode 23. The PIP capacitor element C is formed in the planarly overlapping region of the lower and upper electrodes 16, 23. Plugs 37*b* coupled electrically to the lower electrode 16 are formed in the non-overlapping regions of the lower electrode 16, while plugs 37*c* coupled electrically to the upper electrode 23 are formed in the non-overlapping regions of the upper electrode 23. The plugs 37*b* coupled electrically to the lower electrode 16 are coupled to wiring lines HL2, while the plugs 37*c* coupled electrically to the upper electrode 23 are coupled to wiring lines HL3. By forming the plugs 37*c* coupled to the upper electrode 23 in the non-overlapping regions of the upper electrode 23 it is possible to improve the reliability of the PIP capacitor element.

For example, in the case of a shape wherein the upper electrode is included in the lower electrode planarly, there exists only a planarly overlapping region between the upper and lower electrodes. It follows that the plugs coupled electrically to the upper electrode are formed on the overlapping region. That is, the plugs coupled to the upper electrode are formed on the PIP capacitor element formed in the overlapping region. In this case, if the plugs coupled to the upper electrode are formed, there is a fear of damage to a capacitor insulating film which is in contact with the bottoms of the plugs. Since the capacitor insulating film plays an important role in the characteristics of the PIP capacitor element, damage of the capacitor insulating film would lead to deterioration in characteristics of the PIP capacitor element.

To avoid this inconvenient, as shown in FIG. 2, the upper electrode 23 and the lower electrode 16 are formed in different rectangular shapes to provide an overlapping region and non-overlapping regions. The overlapping region serves as the PIP capacitor element, while the non-overlapping regions of the upper electrode 23 serve as lead-out regions of the upper electrode 23. By forming the plugs 37*c* coupled to the upper electrode 23 in the lead-out regions formed non-overlapping regions it is possible to prevent damage to the capacitor insulating film of the PIP capacitor element formed in the overlapping region. Since the PIP capacitor element C is not formed in the non-overlapping regions (lead-out regions) of the upper electrode 23, even if the plugs 37*c* are formed in the non-overlapping regions, there is no problem in point of characteristics of the PIP capacitor element. For this reason there is used the PIP capacitor element C of a structure having both overlapping region and non-overlapping regions as in FIG. 2. With the PIP capacitor element C of such a structure as a premise, features of the PIP capacitor element C in this first embodiment will be described below with reference to a sectional view.

Figure 3:
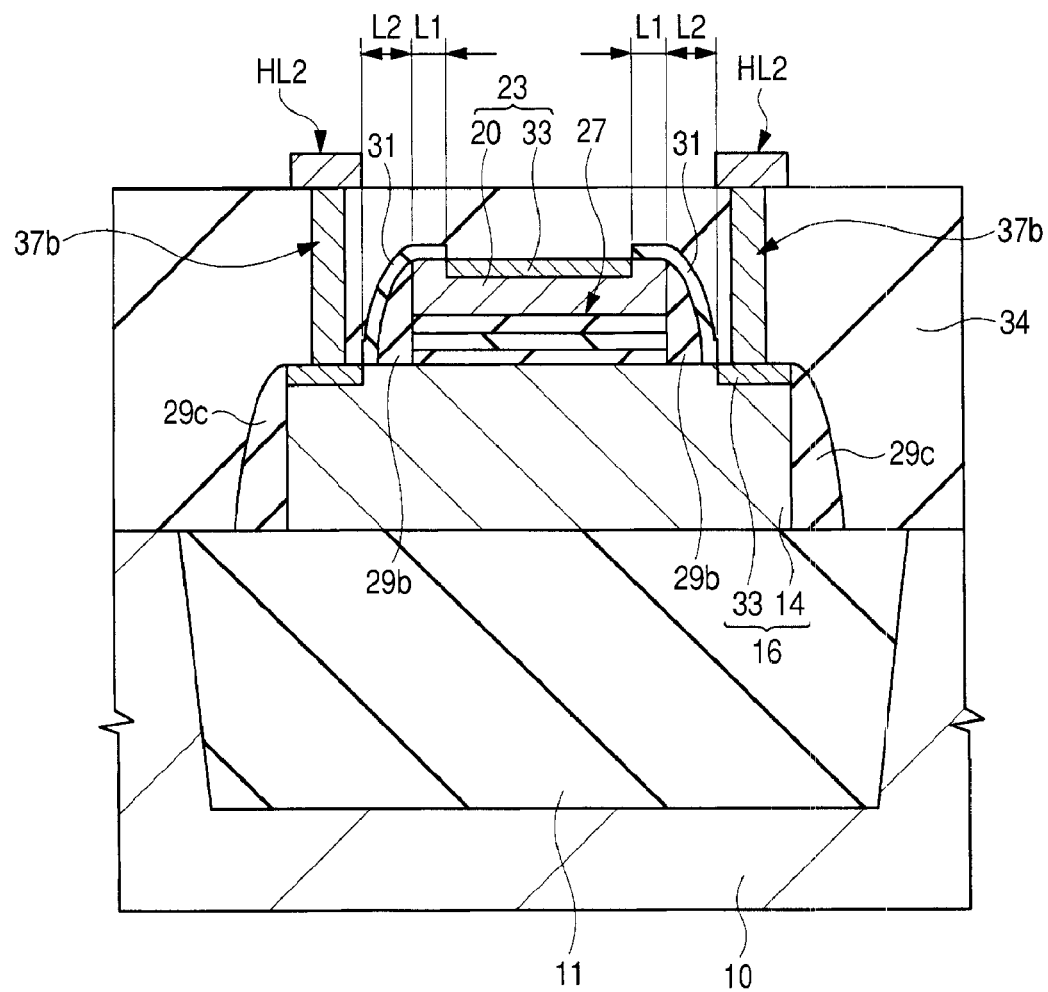
FIG. 3 is a sectional view taken on line A-A in FIG. 2.

FIG. 3 is a sectional view taken on line A-A in FIG. 2. As shown in FIG. 3, an element isolation region 11 is formed on a semiconductor substrate 10 made of a single silicon crystal for example and a PIP capacitor element is formed on the element isolation region 11. The PIP capacitor element includes a lower electrode 16 formed on the element isolation region. The lower electrode 16 is comprised of a polysilicon film 14 and a cobalt silicide film 33 formed on a surface of the polysilicon film 14. A capacitor insulating film 27 having a length shorter in x direction (lateral direction in FIG. 3) than the lower electrode 16 is formed on the lower electrode 16. For example, the capacitor insulating film 27 is comprised of a laminate of silicon oxide film, silicon nitride film and silicon oxide film. An upper electrode 23 is formed on the capacitor insulating film 27. The upper electrode 23 is comprised of a polysilicon film 20 and a cobalt silicide film 33 formed on a surface of the polysilicon film 20.

Then, side walls 29*b* are formed on side walls respectively of the upper electrode 27 and the capacitor insulating film 27 and side walls 29*c* are formed on side walls of the lower electrode 16. The side walls 29*b* formed on the side walls of the upper electrode 23 and the capacitor insulating film 27 function to improve the insulation between the upper electrode 23 and the lower electrode 16.

In the A-A section of FIG. 2, which is shown in FIG. 3, the length of the lower electrode 16 is larger than that of the upper electrode 23, so that, as shown in FIG. 3, in the region where the lower electrode 16 is formed there exist an overlapping region overlapping with the upper electrode 23 and non-overlapping regions where the upper electrode 23 is not formed over the lower electrode 16. Therefore, the PIP capacitor element is formed in the overlapping region where the lower electrode 16 and the upper electrode 23 overlap each other planarly. On the other hand, a cobalt silicide film is formed in each of the non-overlapping regions of the lower electrode 16 and plugs 37*b* are formed on the cobalt silicide film 33, the plugs 37*b* extending through an interlaying insulating film 34 and being coupled to the lower electrode 16 electrically. The plugs 37*b* are coupled to wiring lines HL2 formed on the interlayer insulating film 34. The cobalt silicide film 33 formed on the non-overlapping regions of the lower electrode 16 are for making the lower electrode 16 low in resistance. The cobalt silicide film 33 is formed also on a surface of the upper electrode 23, whereby the upper electrode 23 is made low in resistance. Therefore, it can be said desirable from the standpoint of making the upper electrode 23 and the lower electrode 16 low in resistance that the cobalt silicide film 33 formed on the surface of the upper electrode 23 and the cobalt silicide film 33 formed on the non-overlapping regions of the lower electrode 16 be formed in as large regions as possible.

However, for example, if the cobalt silicide film is formed throughout the whole surface of the upper electrode, it is formed even at planar boundaries (end portions of the upper electrode 23) between the upper electrode 23 and the lower electrode 16. In this case, if the cobalt silicide film 33 grows abnormally in the siliciding process for forming the cobalt silicide film 33, the cobalt silicide film 33 is formed while creeping up along the side walls 29*b* from end portions of the upper electrode 23. The cobalt silicide film 33 thus formed while creeping up along the side walls 29*b* is coupled to the cobalt silicide film 33 formed in the non-overlapping regions of the lower electrode 16. As a result, the upper electrode 23 and the lower electrode 16 are rendered conductive by the cobalt silicide film 33 and the PIP capacitor element no longer operates normally.

To avoid such an inconvenience, as shown in FIG. 3, one feature of this first embodiment resides in that the cobalt silicide film 33 is not formed throughout the whole surface of the upper electrode 23, but is formed in an inner region spaced apart a distance L1 from each end portion of the upper electrode 23. That is, the cobalt silicide film 33 is formed in only a region spaced apart from end regions of the upper electrode 23. In other words, the cobalt silicide film 33 is not formed in regions closer than L1 as the distance from each end region of the upper electrode 23. By so doing it is possible to prevent the cobalt silicide film 33 from growing abnormally while creeping along the side walls 29*b* from end portions of the upper electrode 23. Thus, in this first embodiment, end portions of the cobalt silicide film 33 formed on the surface of the upper electrode 23 lie inside spaced apart from end portions of the upper electrode 23. That is, the cobalt silicide film 33 is not present at end portions of the upper electrode 23, thus making it possible to prevent abnormal growth of the cobalt silicide film 33.

This first embodiment is characteristic in that the cobalt silicide film 33 is not formed at end portions of the upper electrode 23. In other words, the cobalt silicide film 33 is spaced apart from the side walls 29b formed at end portions of the upper electrode 23. Consequently, it is possible to prevent the cobalt silicide film 33 from creeping out from end portions of the upper electrode 23 toward the side walls 29b. In this embodiment the cobalt silicide film 33 is formed so as to be spaced apart the distance L1 from each end portion of the upper electrode 23. The distance L1 is a sufficient distance for preventing the cobalt silicide film 33 from creeping out to the side walls 29b. Even if the distance L1 is short, it is possible to prevent the cobalt silicide film 33 from creeping up to the side walls 29b in comparison with the case where the cobalt silicide film 33 is formed up to end portions of the upper electrode 23. That is, the distance L1 indicates that an end portion of the cobalt silicide film 33 is spaced apart from the upper electrode 23. As long as this separation is ensured, even if the distance L1 is short, it is possible to prevent the occurrence of a short-circuit defect between the upper electrode 23 and the lower electrode 16 caused by abnormal growth of the cobalt silicide film 33.

A concrete description will now be given about an optimum distance L1. The cobalt silicide film 33 is formed on the upper electrode 23 in the following manner. Cobalt film is deposited on the upper electrode 23 comprised of the polysilicon film 20, followed by heat treatment, whereby there occurs a silicidation reaction between the polysilicon film 20 and the cobalt film and the cobalt silicide film 33 is formed on the surface of the polysilicon film. At this time, if the thickness of the cobalt film deposited on the polysilicon film 20 is set at about 10 nm for example, the thickness of the cobalt silicide film formed is about 20 nm. Therefore, by setting the distance L1 at about 20 nm it is possible to prevent the cobalt silicide film 33 from reaching end portions of the upper electrode 23. That is, by setting the distance L1 from an end portion of the cobalt silicide from 33 to an end portion of the upper electrode 23 it is possible to effectively prevent the cobalt silicide film from creeping out to the side walls 29b from end portions of the upper electrode 23. However, the distance L1 of 20 nm is a value taken when the deposition thickness of the cobalt film is about 10 nm and the value of the distance L1 can vary depending on the deposition thickness of the cobalt film and the thickness of the cobalt silicide film 33 formed. Although a concrete numerical example of the distance L1 has been shown, the features of this first embodiment are not limited thereto insofar as end portions of the cobalt silicide film 33 are spaced apart from end portions of the upper electrode 23. Particularly, if the distance L1 from the upper electrode 23 is approximately equal to the thickness of the cobalt silicide film, it is possible to fully prevent the occurrence of a short-circuit defect between the upper electrode 23 and the lower electrode 16 caused by abnormal growth of the cobalt silicide film 33.

A description will now be given a further characteristic configuration which can diminish a short-circuit defect between the upper electrode 23 and the lower electrode 16 caused by abnormal growth of the cobalt silicide film 33. As shown in FIG. 3, another feature of this first embodiment resides in that the cobalt silicide film 33 formed on a surface of the lower electrode 16 is also spaced apart from boundaries (stepped regions) between the upper electrode 23 and the lower electrode 16. More specifically, the cobalt silicide film 33 is formed on the lower electrode 16 so as to be spaced apart from the side walls 29b formed at the boundaries (stepped regions) between the upper electrode 23 and the lower electrode 16. By so doing, even if the cobalt silicide film 33 creeps out along surfaces of the side walls 29b from the upper electrode 23, it is possible to prevent the creeping cobalt silicide film from joining the cobalt silicide film formed on the lower electrode 16. As a result, it is possible to diminish the occurrence of a short-circuit defect between the upper electrode 23 and the lower electrode 16.

For example, in the case where the cobalt silicide film 33 formed on the surface of the lower electrode 16 is put in contact with the side walls 29b, the cobalt silicide film 33 creeping out from end portions of the upper electrode 23 to the side walls 29b becomes easier to contact the cobalt silicide film 33 formed on the surface of the lower electrode 16. On the other hand, by spacing the cobalt silicide film 33 formed on the lower electrode 16 apart from the side walls 29b it is possible to prevent an electrical coupling between the cobalt silicide film creeping out from end portions of the upper electrode 23 to the side walls 29b and the cobalt silicide film 33 formed on the lower electrode 16. That is, by forming the cobalt silicide film 33 on the lower electrode 16 so as to be spaced apart the distance L2 from the boundaries (stepped regions) between the upper electrode 23 and the lower electrode 16 it is possible to diminish the occurrence of a short-circuit defect between the upper electrode 23 and the lower electrode 16.

A concrete description will now be given about an optimum distance L2. For example, if the thickness of the cobalt film deposited on the polysilicon film 14 is assumed to be about 10 nm, the thickness of the resulting cobalt silicide film 33 is about 20 nm. Therefore, by setting the distance L2 at about 20 nm, the cobalt silicide film 33 creeping out along the side walls 29b can be prevented from contacting the cobalt silicide film 33 formed on the lower electrode 16. That is, by spacing end portions of the cobalt silicide film 33 on the lower electrode 16 about 20 nm apart from the boundaries between the upper electrode 23 and the lower electrode 16 it is possible to effectively prevent an electrical contact between the cobalt silicide film 33 creeping out along the side walls 29b from end portions of the upper electrode 23 and the cobalt silicide film 33 formed on the lower electrode 16. However, the distance L2 of 20 nm is a value taken when the deposition thickness of the cobalt film is about 10 nm and the value of L2 can vary depending on the deposition thickness of the cobalt film and the thickness of the cobalt silicide film 33 formed. Although a concrete numerical example of the distance L2 has been described, the features of this first embodiment are not limited thereto insofar as end portions of the cobalt silicide film 33 formed on the lower electrode 16 are spaced apart from the boundaries between the upper electrode 23 and the lower electrode 16. Particularly; if the distance L2 from each boundary is approximately equal to the thickness of cobalt silicide film, it is possible to fully prevent the occurrence of a short-circuit defect between the upper electrode 23 and the lower electrode 16 caused by abnormal growth of the cobalt silicide film 33.

Thus, this first embodiment adopts two characteristic configurations for preventing the occurrence of a short-circuit defect between the upper electrode 23 and the lower electrode 16. The first feature resides in that end portions of the cobalt silicide film 33 formed the upper electrode 23 are spaced the distance L1 from end portions of the upper electrode 23. According to this configuration it is possible to prevent the cobalt silicide film 33 from reaching end portions of the upper electrode 23 and creeping out along the side walls 29b. The second feature resides in that end portions of the cobalt silicide film 33 formed on the lower electrode 16 are spaced the distance L2 from the boundaries between the upper electrode 23 and the lower electrode 16, namely, the point that the cobalt silicide film 33 formed on the lower electrode 16 is spaced apart from the side walls 29b. This second feature plays a complementary role for the first feature. More particularly, the first feature affords the effect that it is possible to prevent the cobalt silicide film 33 from reaching end portions of the upper electrode 23 and creeping out to the side walls 29b. According to the second feature, the cobalt silicide film 33 formed on the lower electrode 16 is spaced apart from the side walls 29b. Therefore, it is possible to prevent contact between the cobalt silicide film 33 creeping out along the side walls 29b and the cobalt silicide film 33 formed on the lower electrode 16. Thus, in the PIP capacitor element of this first embodiment, it is possible to effectively prevent the occurrence of a short-circuit defect between the upper electrode 23 and the lower electrode 16 caused by abnormal growth of the cobalt silicide film 33.

The configuration (first feature) that end portions of the cobalt silicide film 33 formed on the upper electrode 23 are spaced apart the distance L1 from end portions of the upper electrode 23 and the second configuration (second feature) that end portions of the cobalt silicide film 33 formed on the lower electrode 16 are spaced apart the distance L2 from the boundaries between the upper electrode 23 and the lower electrode 16 can be implemented in the following manner. For example, as shown in FIG. 3, a silicon oxide film 31 as an insulating film is formed so as to cover the regions (regions within the upper electrode 23) inside of the distance L1 from end portions of the upper electrode 23 and the regions (regions within the lower electrode 16) inside the distance L2 from the boundaries between the upper electrode 23 and the lower electrode 16. Thereafter, with the silicon oxide film 31 thus formed, a cobalt silicide film 33 is formed. Thus, a direct contact between polysilicon film and cobalt film can be avoided in the regions where the silicon oxide film 31 was formed. Accordingly, it is possible to avoid formation of the cobalt silicide film 33 in the regions (regions within the upper electrode 23) inside of the distance L1 from end portions of the upper electrode 23 and also in the regions (regions within the lower electrode 16) inside of the distance L2 from the boundaries between the upper electrode 23 and the lower electrode 16. The insulating film used to inhibit formation of the cobalt silicide film is not limited to the silicon oxide film 31, but it may be another film, e.g., silicon nitride film.

Next, a description will be given about another problem which causes deterioration in reliability of the PIP capacitor element in this first embodiment, as well as means for solving the problem. In this first embodiment the PIP capacitor element has a planarly overlapping region between the upper electrode and the lower electrode and planarly non-overlapping regions. The overlapping region is utilized as a region for forming the PIP capacitor element, while the non-overlapping regions are utilized as lead-out regions coupled to plugs. In such configuration there occur stepped portions between the overlapping region where the upper electrode is formed over the lower electrode through a capacitor insulating film and the non-overlapping regions where the upper electrode is formed over the element isolation region. That is, since the upper electrode extends over the overlapping region and the non-overlapping regions, there occur stepped portions between the overlapping region and the non-overlapping regions. In this first embodiment a description will be given first about the problem resulting from formation of the stepped portions in the upper electrode and then about means for solving the problem.

Figure 4:
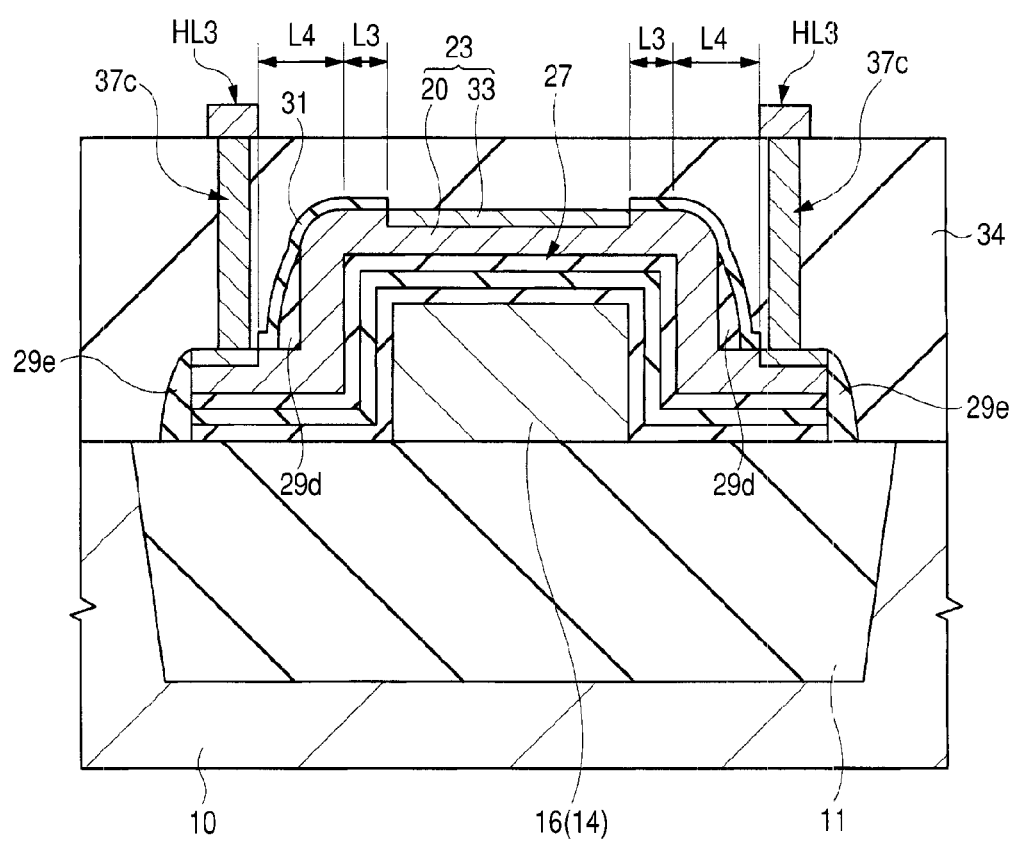
FIG. 4 is a sectional view taken on line B-B in FIG. 2.

FIG. 4 is a sectional view taken on line B-B in FIG. 2. As shown in FIG. 4, an element isolation region 11 is formed in a semiconductor device 10 and a PIP capacitor element is formed on the element isolation region 11. The PIP capacitor element has a lower electrode 16 on the element isolation region 11 and a capacitor insulting film 27 is formed so as to cover the lower electrode 16, with an upper electrode 23 being formed on the capacitor insulating film 27. In this B-B section, the length of the upper electrode 23 is larger than that of the lower electrode 16, so that stepped regions are formed in the upper electrode 23, as shown in FIG. 4. That is, in the upper electrode 23 there exist an overlapping region where the lower electrode 16 lies as an underlying layer and non-overlapping regions (lead-out regions) where the lower electrode 16 does not lie as an underlying layer. There inevitably occur stepped regions between the overlapping region and the non-overlapping regions. An interlayer insulating film 34 is formed on the upper electrode 23 and plugs 37c are formed in the interlayer insulating film 34, the plugs 37c extending through the interlayer insulating film 34 and reaching the upper electrode 23. The plugs 37c are formed so as to be coupled to the non-overlapping regions of the upper electrode 23. Further, side walls 29e are formed at end portions of the upper electrode 23 and side walls 29d are also formed in stepped regions formed between the overlapping region and the non-overlapping regions of the upper electrode 23.

As shown in FIG. 4, the upper electrode 23 is comprised of a polysilicon film 20 and a cobalt silicide film 33 formed on a surface of the polysilicon film 20. The cobalt silicide film 33 is formed by silicidation of the polysilicon film 20. The silicidation is accelerated at upper end portions of the stepped regions (boundary regions between the overlapping region and the non-overlapping regions) of the upper electrode 23. The reason is that side walls 29d are formed on side walls of the stepped regions, but at the upper end portions of the stepped regions the side walls 29d are easily removed and the polysilicon film 20 is exposed. That is, at the upper end portions of the stepped regions, the silicidation proceeds in both horizontal and vertical directions, so that the thickness of the cobalt silicide film 33 tends to becomes larger than that of the other regions. Consequently, at the upper end portions of the stepped regions, the distance between the cobalt silicide film 33 and the capacitor insulating film 27 becomes short and the thickness of the cobalt silicide film 33 becomes larger, so that field concentration is apt to occur. Thus, at the upper end portions of the stepped regions, dielectric breakdown of the capacitor insulating film 27 is apt to occur under the influence of field concentration and also under the influence of a shorter distance between the cobalt silicide film 33 and the capacitor insulating film 27. Once dielectric breakdown of the capacitor insulating film 27 occurs, the PIP capacitor element fails to operate normally and there arises the problem that the reliability of the PIP capacitor element is deteriorated. This problem inevitably arises from the configuration including stepped regions in the upper electrode and is peculiar to the PIP capacitor element in this first embodiment.

In this first embodiment, to solve the above-mentioned problem, a silicon oxide film 31 as an insulating film is formed in each of regions located within a predetermine range from the stepped regions, whereby it is possible to prevent the cobalt silicide film 33 from being formed in regions located within the predetermined range from the stepped regions. More specifically, the cobalt silicide film 33 is not formed within the range of distance L3 from each stepped region of the upper electrode 23 toward the overlapping region and also within the range of distance L4 from each stepped region toward the associated non-overlapping region (side wall 29d- formed region). That is, the silicon oxide film 31 is formed so as to cover the regions within the range of distance L3 from the stepped regions toward the overlapping region and also cover the regions within the range of distance L4 from the stepped regions toward the non-overlapping regions (sidewalls 29d-formed regions). Consequently, the cobalt silicide film 33 formed on the surface of the upper electrode 23 is spaced apart from the stepped regions which are present in the boundary regions between the overlapping region and the non-overlapping regions. Thus, the upper end portions of the stepped regions are covered with the silicon oxide film 31 and are not formed with cobalt silicide film 33, so there is no fear that the silicidation may proceed in both horizontal and vertical direction. Since the cobalt silicide film 33 is thus not formed at the upper end portions of the stepped regions, it is possible to eliminate the influence of field concentration in the stepped regions and the influence of shorter distance between the cobalt silicide film 33 and the capacitor insulating film 27. Consequently, in the PIP capacitor element according to this first embodiment, it is possible to prevent dielectric breakdown of the capacitor insulating film 27 and improve the reliability of the capacitor features.

A concrete description will now be given about an optimum distance L3. If the thickness of the cobalt film deposited on the polysilicon film 20 is assumed to be about 10 nm, the thickness of the cobalt silicide film 33 formed is bout 20 nm. Therefore, by setting the distance L3 at about 20 nm, there is no fear of the cobalt silicide film 33 extending up the upper end portions of the stepped regions. That is, by spacing end portions of the cobalt silicide film 33 formed in the overlapping region of the upper electrode 23 about 20 nm apart from the boundaries of the stepped regions, it is possible to effectively prevent formation of the cobalt silicide film 33 at the upper end portions of the stepped regions. However, the distance L3 of 20 nm is a value taken when the deposition thickness of the cobalt film is about 10 nm and it can vary depending on the deposition thickness of the cobalt film and the thickness of the cobalt silicide film 33 formed. Although a concrete numerical example of the distance L3 has been shown, the features of this first embodiment are not limited thereto insofar as end portions of the cobalt silicide film 33 formed in the overlapping region of the upper electrode 23 are spaced apart from the stepped regions. Particularly, if the distance L3 from the stepped regions is approximately equal to the thickness of the cobalt silicide film, it is possible to fully prevent formation of the cobalt silicide film in the stepped regions.

Further, a description will be given about an optimum distance L4. From the standpoint that the cobalt silicide film 33 is not formed at the upper end portions of the stepped regions, it suffices for the distance L4 to be a distance at which the upper end portion of each stepped region includes an exposed region. That is, it suffices for the distance L4 to be a distance which covers from the boundary of each stepped region up to near the region where the associated side wall 29d is formed. However, in the first embodiment illustrated in FIG. 4, the distance L4 extends from the boundary of the stepped region up to a region spaced apart from the side wall 29d beyond the same wall. This is done in consideration of misalignment which occurs in a photolithography technique. According to the photolithography technique, the silicon oxide film 31 is formed so as to cover regions within the range of distance L from the stepped regions toward the overlapping region and regions within the range of distance L4 from the stepped regions toward the non-overlapping regions (side walls 29d-formed regions). That is, it is intended to prevent the stepped regions from being uncovered with the silicon oxide film 31 and left exposed by misalignment in the photolithography technique. Therefore, it is preferable that the distance L4 be equal to or larger than the thickness of the upper electrode 24.

Features of the PIP capacitor element in this first embodiment will be summarized as follows. First, in the PIP capacitor element in this first embodiment it is an important object to improve the reliability of capacitor characteristics. There are two concrete objects for achieving the important object. One object is to remedy the short-circuit defect between the upper electrode and the lower electrode caused by abnormal growth of the cobalt silicide film and thereby improve the reliability. To achieve this object, as shown in FIG. 3, end portions of the cobalt silicide film 33 formed on the upper electrode 23 are spaced apart the distance L1 from end portions of the upper electrode 23, whereby it is possible to prevent the cobalt silicide film 33 from reaching end portions of the upper electrode 23 and creeping out to the side walls 29b. Besides, end portions of the cobalt silicide film 33 formed on the lower electrode 16 are spaced apart the distance L2 from the boundaries between the upper electrode 23 and the lower electrode 16. According to this configuration, even if the cobalt silicide film 33 grows abnormally and creeps out to the side walls 29b, the cobalt silicide film 33 formed on the lower electrode 16 is spaced apart from the side walls 29b. Thus, there is obtained an effect that it is possible to prevent contact between the cobalt silicide film 33 creeping out along the side walls 29b and the cobalt silicide film 33 formed on the lower electrode 16.

Another object is to prevent dielectric breakdown of the capacitor insulating film and thereby improve the reliability. To achieve this object, as shown in FIG. 4, the cobalt silicide film 33 is formed neither within the range of distance L3 from the stepped regions formed in the upper electrode 23 toward the overlapping region nor within the range of distance L4 from the stepped regions toward the non-overlapping regions (side walls 29d-formed regions). Since the cobalt silicide film 33 is not formed at the upper end portions of the stepped regions, it is possible to eliminate the influence of field concentration in the stepped regions and the influence of a shorter distance between the cobalt silicide film 33 and the capacitor insulating film 27. Thus, in the PIP capacitor element according to this first embodiment, it is possible to prevent dielectric breakdown of the capacitor element 27 and improve the reliability of the capacitor characteristics.

Figure 5:
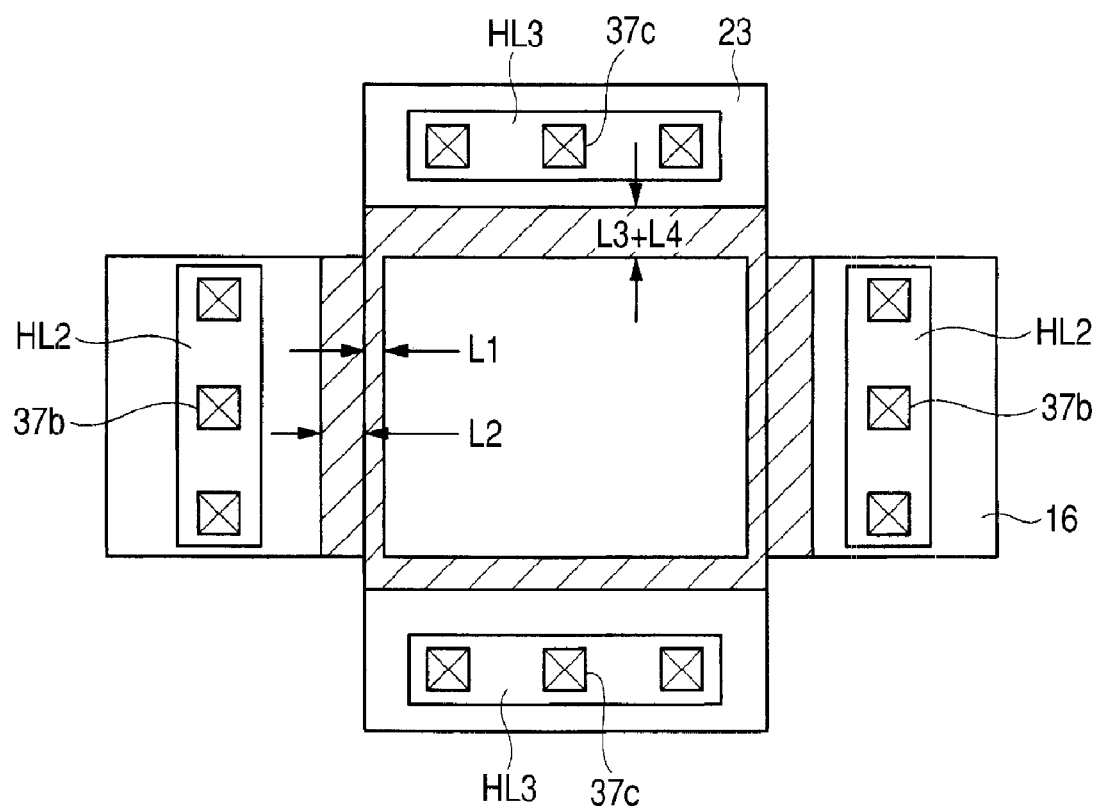
FIG. 5 is a plan view showing a feature of the capacitor element in the first embodiment.

FIG. 5 is a plan view showing a characteristic configuration of this first embodiment. In the same figure there are illustrated hatched regions defined by distances L1 and L2 in the boundary regions between the upper electrode 23 and the lower electrode 16. Further, hatched regions defined by distances L3+L4 are illustrated in the boundary regions (stepped regions) between the overlapping region and the non-overlapping regions of the upper electrode 23. It is a feature of this first embodiment that the cobalt silicide film is not formed in those hatched regions. According to this feature it is possible to prevent the occurrence of a short-circuit defect caused by creeping up of the cobalt silicide film from end regions of the upper electrode 23 and reaching the surface of the lower electrode 16 and also prevent dielectric breakdown of the capacitor insulating film caused by field concentration in the stepped regions of the upper electrode 23. Although in connection with the PIP capacitor element according to this first embodiment a description is being given about an example in which the cobalt silicide film as an example of the metal silicide film is formed on the surface of the upper electrode 23 and that of the lower electrode 16, the technical idea in this first embodiment is applicable also to the case where a titanium silicide film or a nickel silicide film is formed as the metal silicide film.

In this first embodiment, as described above, a feature resides in the structure of the PIP capacitor element which is formed in the semiconductor chip CHP shown in FIG. 1. Although the structure of the PIP capacitor element has been described above, there sometimes is a case where the PIP capacitor element is formed simultaneously in the process of forming a memory cell of the flash memory 4 as will be described later. Therefore, a description will be given below while making reference to illustrations about a memory cell of the flash memory 4 formed in the semiconductor chip CHP and a PIP capacitor element used in a drive circuit of the flash memory 4.

Figure 6:
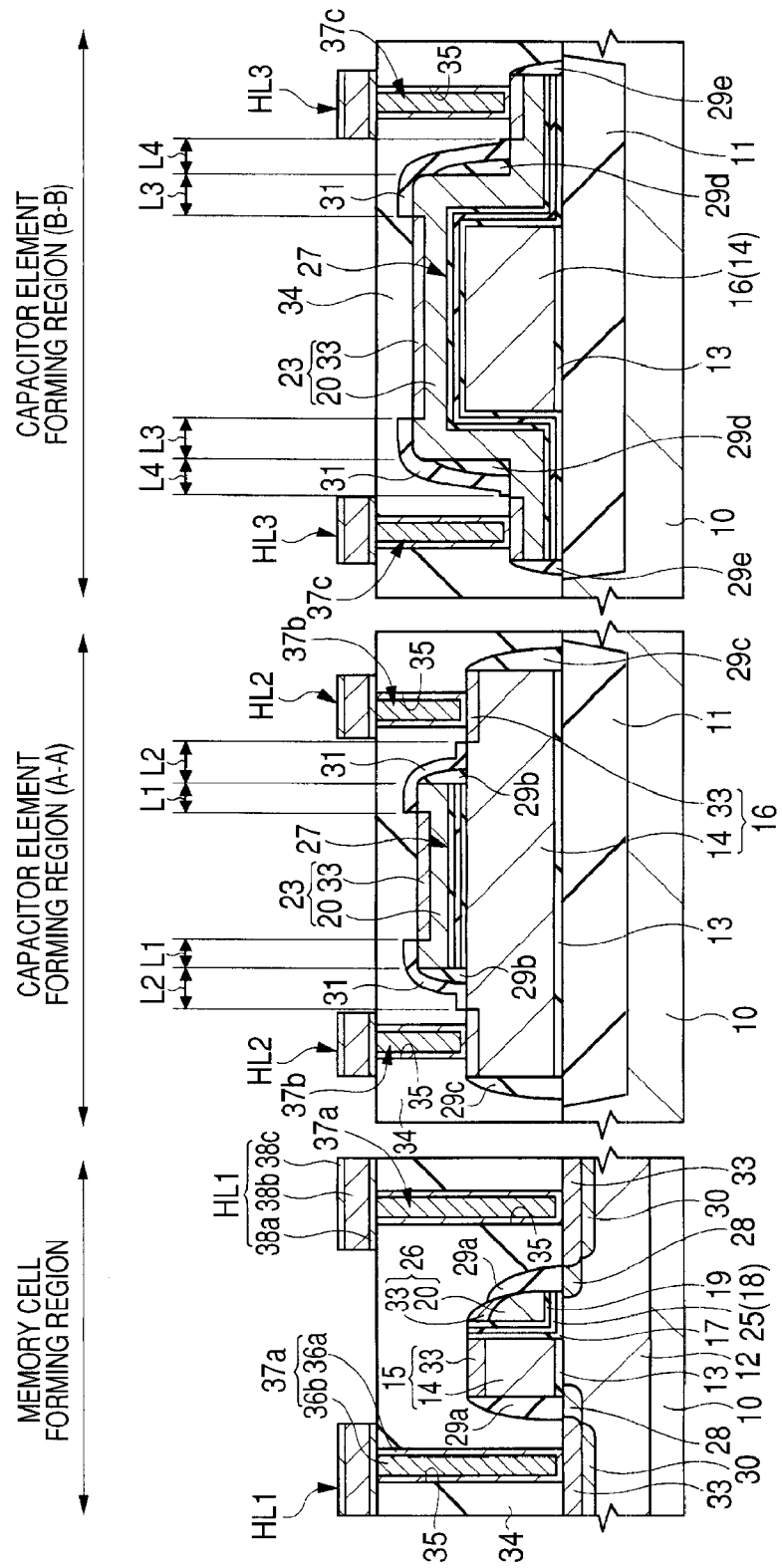
FIG. 6 is a sectional view showing the configuration of a memory cell and that of the capacitor element in the first embodiment.

FIG. 6 is a sectional view showing the structure of a memory cell of the flash memory and that of a PIP capacitor element formed in the analog circuit for example. In FIG. 6, the memory cell is formed in a memory cell-forming region (first region) of a semiconductor chip and the PIP capacitor element is formed in a capacitor element-forming region (second region) of the semiconductor chip.

First, a description will be given about the structure of the memory cell of the flash memory. As shown in FIG. 6, in the memory cell-forming region, a p-type well 12 is formed on a semiconductor substrate 10 and a memory cell is formed on the p-type well 12. This memory cell is comprised of a select section for selecting the memory cell and a storage section for the storage of information. First, reference will be made to the configuration of the select section for selecting a memory cell. The memory cell has a gate insulating film (first gate insulating film) 13 formed on the semiconductor substrate 10 (p-type well 12), and a control gate electrode (control electrode) 15 is formed on the gate insulating film 13. For example, the gate insulating film 13 is formed of a silicon oxide film and the control gate electrode 15 is comprised of a polysilicon film 14 and a cobalt silicide film 33 formed on the polysilicon film 14. The cobalt silicide film 33 is formed formed for making the control gate electrode 15 low in resistance. The control gate electrode 15 has a function of selecting a memory cell. That is, a specific memory cell is selected by the control gate electrode 15 and write, erase or read operation is performed for the selected memory cell.

The following description is now provided about the configuration of the memory cell storage section. On one side wall of the control gate electrode 15 is formed a memory gate electrode 26 through a laminate of insulating films. The memory gate electrode 26 is in the shape of a side wall formed on one side wall of the control gate electrode 15 and is comprised of a polysilicon film 20 and a cobalt silicide film 33 formed on the polysilicon film 20. The cobalt silicide film is formed for making the memory gate electrode 26 low in resistance.

A laminate film is formed between the control gate electrode 15 and the memory gate electrode 26 and also between the memory gate electrode 26 and the semiconductor substrate 10. The laminate film is comprised of a silicon oxide film (second gate insulating film) 17 formed on the semiconductor substrate 10, a charge storage film 25 (silicon nitride film 18) formed on the silicon oxide film 17, and a silicon oxide film (first insulating film) 19 formed on the charge storage film 25. The silicon oxide film 17 functions as a gate insulating film formed between the memory gate electrode 26 and the semiconductor substrate 10. This gate insulating film as the silicon oxide film 17 also has the function as a tunnel insulating film. For example, since the memory cell storage section inject electrons or holes from the semiconductor substrate 10 into the charge storage film 25 through the silicon oxide film 17 to store or erase information, the silicon oxide film 17 functions as a tunnel insulating film.

The charge storage film 25 formed on the silicon oxide film functions to store an electric charge. More specifically, in this first embodiment, the charge storage film 25 is formed of a silicon nitride film 18. The memory cell storage section in this first embodiment stores information by controlling the electric current flowing through the interior of the semiconductor substrate 10 which underlies the memory gate electrode 26 on the basis of whether there is an electric charge stored in the charge storage film 25. That is, information is stored by utilizing the fact that a threshold voltage of the electric current flowing through the interior of the semiconductor substrate 10 which underlies the memory gate electrode 26 varies depending on whether an electric charge is stored in the charge storage film 25.

In this first embodiment, an insulating film having a trap level is used as the charge storage film 25. A silicon nitride film is mentioned as an example of the insulating film having a trap level, provided no limitation is made thereto, but there also may be used, for example, an aluminum oxide film (alumina). In case of using the insulating film having a trap level as the charge storage film 25, the electric charge is trapped to the trap level formed in the insulating film and is thereby stored in the insulating film.

Heretofore, a polysilicon film has mainly been used as the charge storage film 25, but in case of using a polysilicon film as the charge storage film 25, if there is a defect in part of the silicon oxide film 17 or 19 which surrounds the charge storage film 25, all the electric charge stored in the charge storage film 25 may all be gone due to abnormal leak because the charge storage film 25 is a conductor film.

To avoid such an inconvenience, a silicon nitride film which is an insulator has been used. In this case, an electric charge which contributes to the storage of data is stored to a discrete trap level (capture level) which is present within the silicon nitride film. Therefore, even if a defect occurs in part of the silicon oxide film 17 or 19 which surrounds the charge storage film 25, there is no fear that all the electric charge may be gone from the charge storage film 25, because the electric charge is stored to the discrete trap level. Consequently, it is possible to improve the reliability of data hold.

For such a reason, by using as the charge storage film 25 not only the silicon nitride film but also such a film as includes a discrete trap level it is possible to improve the reliability of data hold.

The memory gate electrode 26 is formed on one of the side walls of the control gate electrode 15 and a side wall 29*a* comprised of a silicon oxide film is formed on the other side wall. Likewise, the control gate electrode 15 is formed on one of the side walls of the memory gate electrode 26 and a side wall 29*a* comprised of a silicon oxide film is formed on the other side wall.

A pair of shallow impurity diffusion regions 28 of a low concentration, which are n-type semiconductor regions, are formed within the semiconductor substrate 10 just underlying the side walls 29*a*, and a pair of deep impurity diffusion regions 30 of a high concentration are formed in outer regions in contact with the pair of shallow impurity diffusion regions 28 of a low concentration. The deep impurity diffusion regions 30 of a high concentration are also n-type semiconductor regions and a cobalt silicide film 33 is formed on a surface of each impurity diffusion region 30. With the pair of impurity diffusion regions 28 of a low concentration and the pair of impurity diffusion regions 30 of a high concentration, there are formed a source region and a drain region of the memory cell. By forming source and drain regions with use the impurity diffusion regions of a low concentration and the impurity diffusion regions 30 of a high concentration, the source and drain regions can be made an LDD (Lightly Doped Drain) structure. A transistor comprised of the gate insulating film 13, the control gate electrode 15 formed thereon and the source and drain regions just described above is here designated a select transistor. On the other hand, a transistor comprised of the laminate of the silicon oxide film 17, charge storage film 25 and silicon oxide film 19, as well as a memory gate electrode 24 formed on the laminate and the source and drain regions described above, is here designated a memory transistor. Thus, it can be said that the select section of the memory cell is comprised of a select transistor, while the memory section of the memory cell is comprised of a memory transistor.

Next, a description will be given about a wiring structure coupled to the memory cell. An interlayer insulating film 34 comprised of a silicon oxide film is formed over the memory cell so as to cover the memory cell. Contact holes 35 are formed through the interlayer insulating film 34 so as to reach the cobalt silicide film 33 which configures source and drain regions. In the interior of each contact hole 35, a titanium/titanium nitride film 36a as a barrier conductor film is formed and a tungsten film 36b is formed so as to fill up the contact hole. By thus burying the titanium/titanium nitride film 36a and the tungsten film 36b into each contact hole 35 there is formed an electrically conductive plug 37a. A wiring line HL1 is formed over the interlayer insulating film 34 and is coupled to the plug 37a electrically. For example, the wiring line HL1 is formed by a laminate of a titanium/titanium nitride film 38a, an aluminum film 38b and a titanium/titanium nitride film 38c.

The memory cell used in this first embodiment is configured as above and the following description is now provided about the operation of the memory cell. It is here assumed that the voltage applied to the control gate 15 is Vcg and the voltage applied to the memory gate 26 is Vmg. It is further assumed that voltages applied to the source and drain regions, respectively, are Vs and Vd and the voltage applied to the semiconductor substrate 10 (p-type well 12) is Vb. Injection of electrons to the silicon nitride film as the charge storage film is defined as "write" and injection of holes to the silicon nitride film is defined as "erase."

A description will be given first about write operation. Write operation is performed by hot electron write which is called a source-side injection method. For example, as write voltages, the voltage Vs applied to the source region is 6V, the voltage Vmg applied to the memory gate electrode 26 is 12V, and the voltage Vcg applied to the control gate electrode 15 is 1.5V. The voltage Vd applied to the drain region is controlled so as to become a set value assuming the presence of a channel current in write operation. At this time the voltage Vd is determined by both a set value of a channel current and a threshold voltage of the select transistor having the control gate electrode 15 and is, for example, about 1V. The voltage Vb applied to the p-type well 12 (semiconductor substrate 10) is 0V.

Reference will now be made to the behavior of an electric charge at the time of performing the write operation under application of such voltages. As noted above, by giving a potential difference between the voltage Vs applied to the source region and the voltage Vd applied to the drain region, electrons flow through a channel region formed between the source region and the drain region. The electrons flowing through the channel region is accelerated in the channel region (between the source and drain regions) located under the vicinity of the boundary between the control gate electrode 15 and the memory gate electrode 26 and become hot electrons. Then, with a vertical electric field induced by the positive voltage (Vmg=12V) applied to the memory gate 26, hot electrons are injected into the silicon nitride film 18 (charge storage film 25) which underlies the memory gate electrode 26. The hot electrons thus injected are trapped to the trap level in the silicon nitride film 18. As a result, electrons are stored in the silicon nitride film and the threshold voltage of the memory transistor rises. In this way there is performed write operation.

The following description is now provided about erase operation. For example, erase operation is performed by BTBT (Band to Band Tunneling) which uses a band-to-band tunneling phenomenon. In BTBT erase, for example, the voltage Vmg applied to the memory gate electrode is −6V, the voltage Vs applied to the source regions is 6V, the voltage Vcg applied to the control gate electrode is 0V, and 0V is applied to the drain region. With voltage applied between the source region and the memory gate electrode, holes generated by the band-to-band tunneling phenomenon at a source region end are accelerated by the high voltage applied to the source region and become hot holes. Then, a portion of the hot holes are attracted to the negative voltage applied to the memory gate electrode 26 and are injected into the silicon nitride film 18. The hot holes thus injected are trapped to the trap level in the silicon nitride film 18, with consequent lowering of the threshold voltage of the memory transistor. In this way there is performed erase operation.

The following description is now provided about read operation. Read operation is performed by setting the voltage Vd to be applied to the drain region at Vdd (1.5V), the voltage Vs to be applied to the source region at 0V, the voltage Vcg to be applied to the control gate electrode at Vdd (1.5V), the voltage Vmg to be applied to the memory gate electrode at Vdd (1.5V) and by passing an electric current in a direction opposite to the direction in write operation. The voltage Vd applied to the drain region and the voltage Vs applied to the source region are interchanged into 0V and 1.5V, respectively, and read operation may be done in the same direction of an electric current as the direction in write operation. At this time, if the memory cell is in a state of write and the threshold voltage is high, there flows no electric current in the memory cell. On the other hand, if the memory cell is in a state of erase and the threshold voltage is low, there flows an electric current in the memory cell.

Thus, whether the memory cell is in a state of write or in a state of erase can be determined by detecting whether an electric current is flowing or not in the memory cell. More specifically, whether an electric current is flowing or not in the memory cell is detected by a sense amplifier. For example, a reference current is used to detect whether there is an electric current flowing in the memory cell. That is, when the memory cell is in a state of erase, a read current flows in read operation, which read current is compared with the reference current. The reference current is set lower than the read current in a state of erase, and if the read current is found larger than the reference current as a result of comparison between the read current and the reference current, it can be determined that the memory cell is in a state of erase. On other hand, when the memory cell is in a state of write, a read current does not flow. That is, when the read current is found smaller than the reference current as a result of comparison between the read current and the reference current, it can be determined that the memory cell is in a state of write. In this way it is possible to perform read operation.

In the memory transistor a laminate film is formed between the memory gate electrode 26 and the semiconductor substrate 10. This laminate film is comprised of the silicon oxide film 17, charge storage film 25 and silicon oxide film 19. Write and erase operations in the memory transistor are performed by the injection of an electric charge into the charge storage film 25. For example, as described above, write operation is performed by injection of electrons into the charge storage film 25 and erase operation is performed by injection of holes into the charge storage film 25. In a state of write, the threshold voltage of the memory transistor is in a raised state by electron injection into the charge storage film 25. At this time, electrons are stored on the control gate electrode 15 side of the charge storage film 25. That is, the electrons stored in the charge storage film 25 are localized in a limited region of the charge storage film 25.

On the other hand, in a state of erase, the threshold voltage of the memory transistor is in a lowered state as a result of injection of holes into the charge storage film 25. At this time, the holes are stored in the source side (the right-hand impurity diffusion region 28 of a low concentration) of the charge storage film 25. Therefore, the holes are also localized in a limited region of the charge storage film 25. In erase operation, the electrons present within the charge storage film 25 are extinguished to lower the threshold value by pair extinction of holes with the electrons injected and stored into the charge storage film 25. However, as noted above, the localized region of electrons and that of holes are different, so if the width of the charge storage film 25 is large, it becomes difficult to effect an efficient pair extinction between electrons and holes and the reliability of the memory transistor is deteriorated. In the memory cell (memory transistor) the polysilicon film 20 is made thin to solve this problem. As a result, the gate length of the memory gate electrode 26 becomes short and therefore the width of the charge storage film 25 formed under the memory gate electrode 26 also becomes small. Consequently, the localized region of electrons and that of holes in the charge storage film 25 come close to each other, whereby the pair extinction of electrons and holes is carried out to a satisfactory extent and there is obtained an effect that the reliability of the memory transistor is improved.

The configuration and operation of the memory cell have been described above. Next, a description will be given about the configuration of the PIP capacitor element. The configuration of the PIP capacitor element is the same as that shown in FIGS. 3 and 4. In FIG. 6, Capacitor Element Forming Region (A-A) is shown in a sectional view corresponding to FIG. 3 and Capacitor Element Forming Region (B-B) is shown in a sectional view corresponding to FIG. 4. In FIG. 6 there is shown a case where the memory cell and the PIP capacitor element are formed in the memory cell forming process and therefore the configuration of the PIP capacitor element will be described below from the standpoint of explaining a correlation between constituent elements of the memory cell and those of the PIP capacitor element.

In FIG. 6, an element isolation region 11 is formed on a semiconductor substrate 10. The element isolation region is a region for separating elements electrically. For example, it is formed for separation between a high voltage-proof MISFET and a low voltage-proof MISFET. The element isolation region 11 is formed also in the capacitor element-forming region. The element isolation region 11 formed in the capacitor element-forming region has a function of isolating the PIP capacitor element formed in the element isolation region 11 from the semiconductor substrate 10. That is, the PIP capacitor element is formed on the element isolation region 11.

A gate insulating film 13 is formed on the element isolation region 11 and a lower electrode 16 of the capacitor element is formed on the gate insulating film 13. The lower electrode 16 is formed of a polysilicon film 14. The lower electrode 16 is formed by the same film as the polysilicon film 14 which configures the control gate electrode 15 formed in the memory cell-forming region. That is, the lower electrode 16 of the PIP capacitor element is formed simultaneously in the process of forming the control gate electrode 15 of the memory cell, although this point will be described later in connection with the manufacturing method.

A capacitor insulating film 27 is formed on the lower electrode 16. The capacitor insulating film 27 is comprised of a silicon oxide film 17, a silicon nitride film 18 formed on the silicon oxide film, and a silicon oxide film 19 formed on the silicon nitride film 18. That is, the capacitor insulating film 27 is formed by the same film as the laminate film which configures the memory transistor of the memory cell. In other words, in the capacitor element-forming region, the laminate comprised of the silicon oxide film, charge storage film 25 (silicon nitride film 18) and silicon oxide film 19 in the memory cell serves as the capacitor insulating film 27 of the capacitor element.

An upper electrode 23 is formed on the capacitor insulating film 27. The upper electrode 23 is comprised of a polysilicon film 20 and a cobalt silicide film 33. The polysilicon film 20 is a constituent film of the memory gate electrode 26 of the memory cell. That is, the polysilicon film 20 as a constituent of the upper electrode 23 is formed simultaneously in the process of forming the memory gate electrode 26 of the memory cell.

In the memory cell (memory transistor), as noted above, the thickness of the polysilicon film 20 is made small from the standpoint of improving the reliability of the memory cell. That is, the gate length of the memory gate electrode 26 is made small by thinning the polysilicon film 20. This is for suppressing localization of electrons and holes and thereby promoting a pair extinction of electrons and holes. The polysilicon film 20 is also used as the upper electrode 23 of the PIP capacitor element. Therefore, by thinning of the polysilicon film 20 is meant thinning of the film of the upper electrode 23 in the PIP capacitor element.

Consequently, in the PIP capacitor element formed in the same process as the memory cell, the polysilicon film 20 as a constituent of the upper electrode 23 is becoming more and more thin. Particularly, a short-circuit defect caused by abnormal growth of the cobalt silicide film 33 is becoming conspicuous as a problem. Thus, in the PIP capacitor element including an overlapping region and non-overlapping regions as regions for forming the upper electrode 23, a short-circuit defect caused by abnormal growth of the cobalt silicide film 33 poses a problem. It is seen that particularly in the PIP capacitor element formed in the same process as the memory cell it is important to take an appropriate countermeasure because the film thickness of he upper electrode 23 becomes smaller.

In this first embodiment, as shown in FIG. 6 (see Capacitor Element Forming Region (A-A)), end portions of the cobalt silicide film 33 formed on the upper electrode 23 are spaced apart a distance L1 from end portions of the upper electrode 23. By so doing there is obtained an effect that it is possible to prevent the cobalt silicide film 33 from reaching the end portions of the upper electrode 23 and creeping out to side walls 29b. Besides, end portions of the cobalt silicide film 33 formed on the lower electrode 16 are spaced apart a distance L2 from boundaries between the upper electrode 23 and the lower electrode 16. In this case, even if the cobalt silicide film 33 grows abnormally and creeps out to the side walls 29b, the cobalt silicide film 33 formed on the lower electrode 16 is spaced apart from the side walls 29b. Accordingly, there is obtained an effect that it is possible to prevent contact between the cobalt silicide film 33 creeping out along the side walls 29b and the cobalt silicide film formed on the lower electrode 16.

Further, as sown in FIG. 6 (see Capacitor Element Forming Region (B-B)), the cobalt silicide film 33 is formed neither within the ranges of distance L3 from stepped regions toward an overlapping region in the upper electrode 23 nor within the ranges of distance L4 from the stepped regions toward non-overlapping regions (side walls 29d-formed regions). Thus, since the cobalt silicide film is not formed at upper end portions of the stepped regions, it is possible to eliminate the influence caused by field concentration in the stepped regions and the influence of a shorter distance between the cobalt silicide film and the capacitor insulating film 27.

Next, a semiconductor device manufacturing method according to this first embodiment will be described below with reference to drawings.

Figure 7:
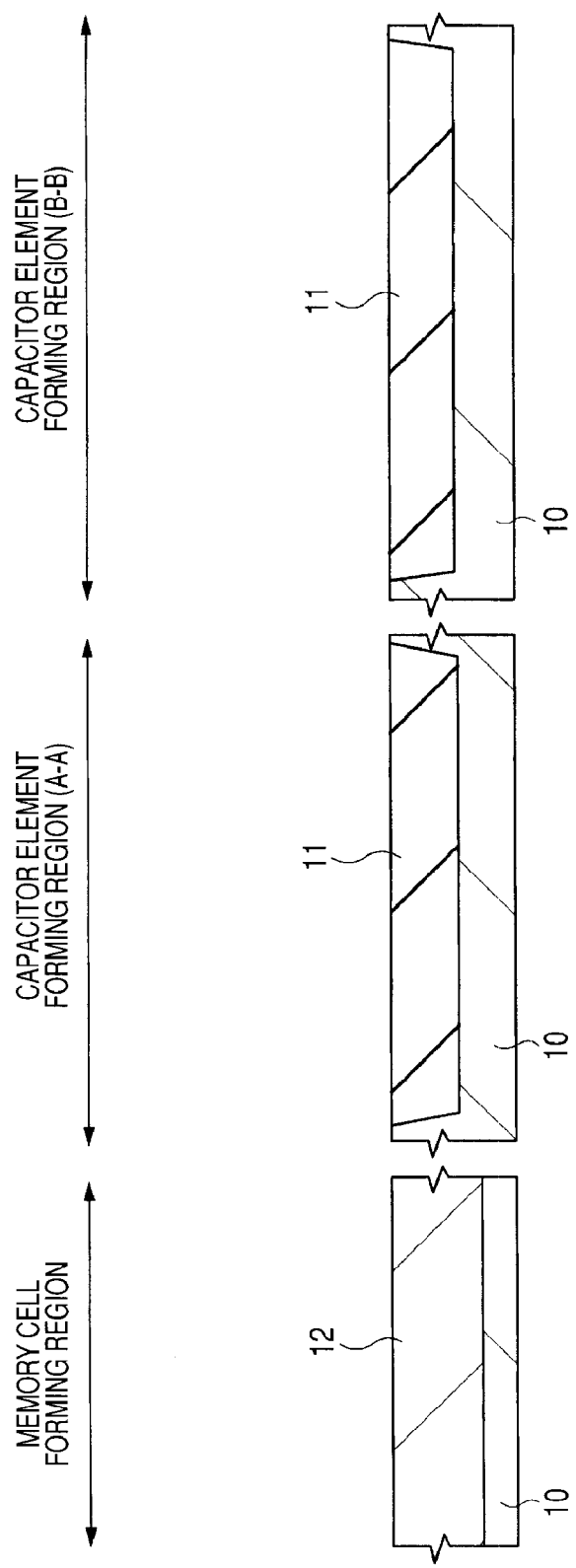
FIG. 7 is a sectional view showing a semiconductor device manufacturing process in the first embodiment.

First, as shown in FIG. 7, there is provided a semiconductor substrate 10 of a single crystal silicon with a p-type impurity such as boron (B) introduced therein. At this time, the semiconductor substrate 10 is in a state of a generally disc-like semiconductor wafer. Then, there is formed an element isolation region for isolation between a low voltage-proof MISFET forming region and a high voltage-proof MISFET forming region of the semiconductor substrate 10. The element isolation region is formed so as to avoid mutual interference of the elements. The element isolation region can be formed, for example, by LOCOS (local oxidation of silicon) method or STI (shallow trench isolation) method. For example, the element isolation region is formed by STI method in the following manner. An element isolation trench is formed in the semiconductor substrate 10 with use of the photolithography technique or etching technique. Then, a silicon oxide film is formed on the semiconductor substrate 10 so as to fill up the element isolation trench and thereafter unnecessary silicon oxide film formed on the semiconductor substrate 10 is removed by CMP (chemical mechanical polishing) method. As a result, there can be formed an element isolation region with silicon oxide film buried into only the element isolation trench. In FIG. 7, an element isolation region 11 is not formed in the memory cell-forming region, but it is formed in the capacitor element-forming region.

Subsequently, a p-type well 12 is formed by introducing an impurity into the semiconductor substrate 10. The p-type well 12 can be formed by introducing a p-type impurity, e.g., boron, into the semiconductor substrate 10 by an ion implantation method. In the memory cell-forming region, a semiconductor region (not shown) for forming a channel of a select transistor is formed in a surface region of the p-type well 12. This channel forming semiconductor region is formed for adjusting a channel-forming threshold voltage.

Figure 8:
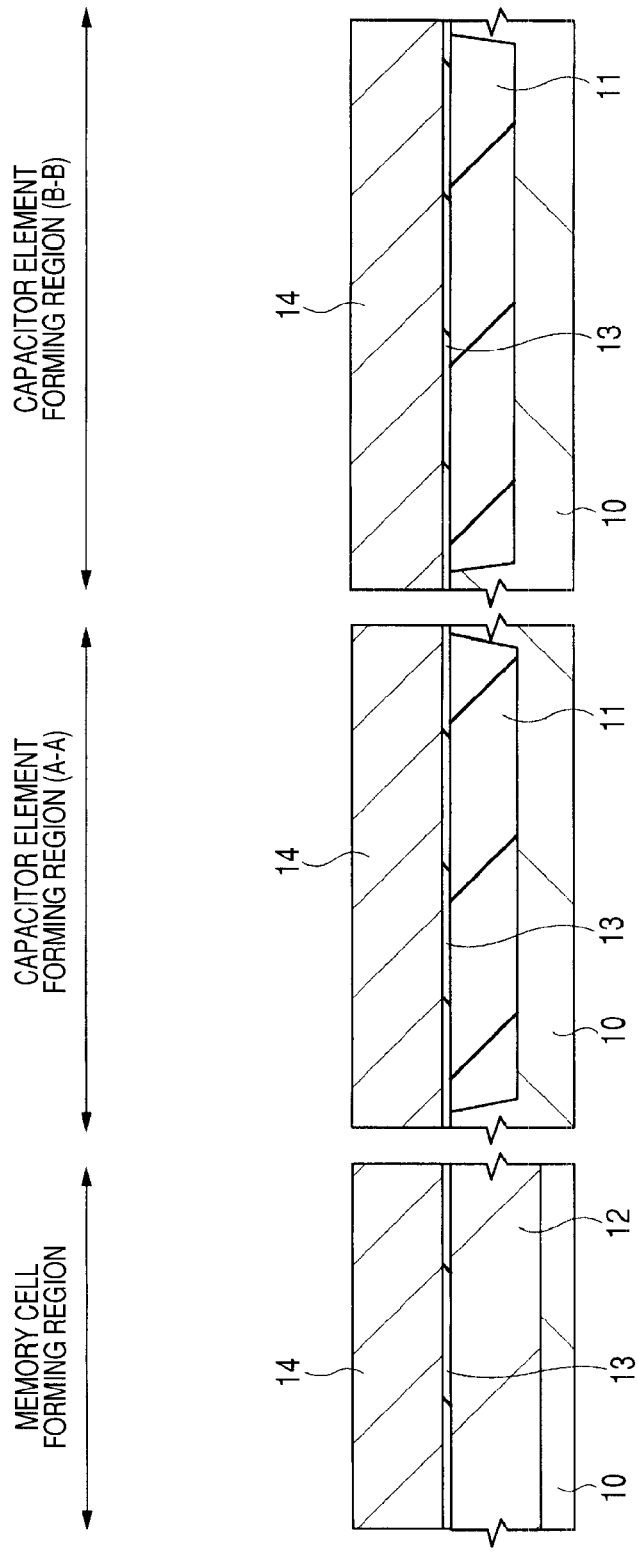
FIG. 8 is a sectional view showing the semiconductor device manufacturing process in a step which follows FIG. 7.

Next, as shown in FIG. 8, a gate insulating film 13 is formed on the semiconductor substrate 10. The gate insulating film 13, which is for example a silicon oxide film, can be formed for example by a thermal oxidation method. However, the gate insulating film 13 is not limited to the silicon oxide film, but various changes may be made. For example, the gate insulating film 13 may be a silicon oxynitride film (SiON). That is, there may be adopted a structure wherein nitrogen is segregated at the interface between the gate insulating film 13 and the semiconductor substrate 10. In comparison with the silicon oxide film, the silicon oxynitride film is highly effective in suppressing the generation of an interface level within the film and diminishing electron trap. Therefore, it is possible to improve the hot carrier resistance and dielectric strength of the gate insulating film 13. Moreover, impurities are difficult to penetrate the silicon oxynitride film in comparison with the silicon oxide film. Therefore, by using the silicon oxynitride film as the gate insulating film 13 it is possible to suppress variation of the threshold voltage caused by diffusion of the impurity present within the gate electrode to the semiconductor substrate 10 side. The silicon oxynitride film can be formed for example by heat-treating the semiconductor substrate 10 in an atmosphere containing nitrogen such as NO, $NO_2$ or $NH_3$. The same effect can be obtained also by forming a silicon oxide film as the gate insulating film 13 on a surface of the semiconductor substrate 10 and thereafter heat-treating the semiconductor substrate 10 in a nitrogen-containing atmosphere, allowing segregation of nitrogen to take place at the interface between the gate insulating film 13 and the semiconductor substrate 10.

The gate insulating film 13 may be formed for example by a film higher in dielectric constant than the silicon oxide film. Heretofore, the silicon oxide film has been used from the standpoint that the dielectric strength is high and that the silicon-silicon oxide interface is high in electrical and physical stability. However, with microminiaturization of elements, there now exists a demand for an ultra-thin film as the gate insulating film 13. If such a thin silicon oxide film is used as the gate insulating film 13, electrons flowing through the MISFET channel tunnel a barrier formed by the silicon oxide film and flow to the gate electrode. Thus, a so-called tunnel current is generated.

In view of this point, by using a material higher in dielectric constant than the silicon oxide film there is formed a high dielectric film capable of being increased in physical thickness even under the same capacity and this high dielectric film has come to be used. With the high dielectric film, it is possible to diminish leak current because a physical film thickness can be increased even under the same capacity.

For example, a hafnium oxide film ($HfO_2$ film), which is one of hafnium oxides, is used as a high dielectric film, but in place of the hafnium oxide film there may be used any of other hafnium-based insulating films such as, for example, hafnium aluminate film, HfON film (hafnium oxynitride film), HfSiO film (hafnium silicate film), HfSiON film (hafnium silicon oxynitride film) and HfAlO film. Further, such oxides as tantalum oxide, niobium oxide, titanium oxide, zirconium oxide, lanthanum oxide and yttrium oxide may be introduced into those hafnium-based insulating films and the resulting hafnium-based insulating films may also be used. Like the hafnium oxide film, the hafnium-based insulating films are higher in dielectric constant than the silicon oxide film and silicon oxynitride film, so there is obtained the same effect as in the use of the hafnium oxide film.

Then, a polysilicon film 14 is formed on the gate insulating film 13. The polysilicon film 14 can be formed, for example, by CVD method. Further, an n-type impurity such as phosphorus or arsenic is introduced into the polysilicon film 14 with use of the photolithography technique and ion implantation method.

Figure 9:
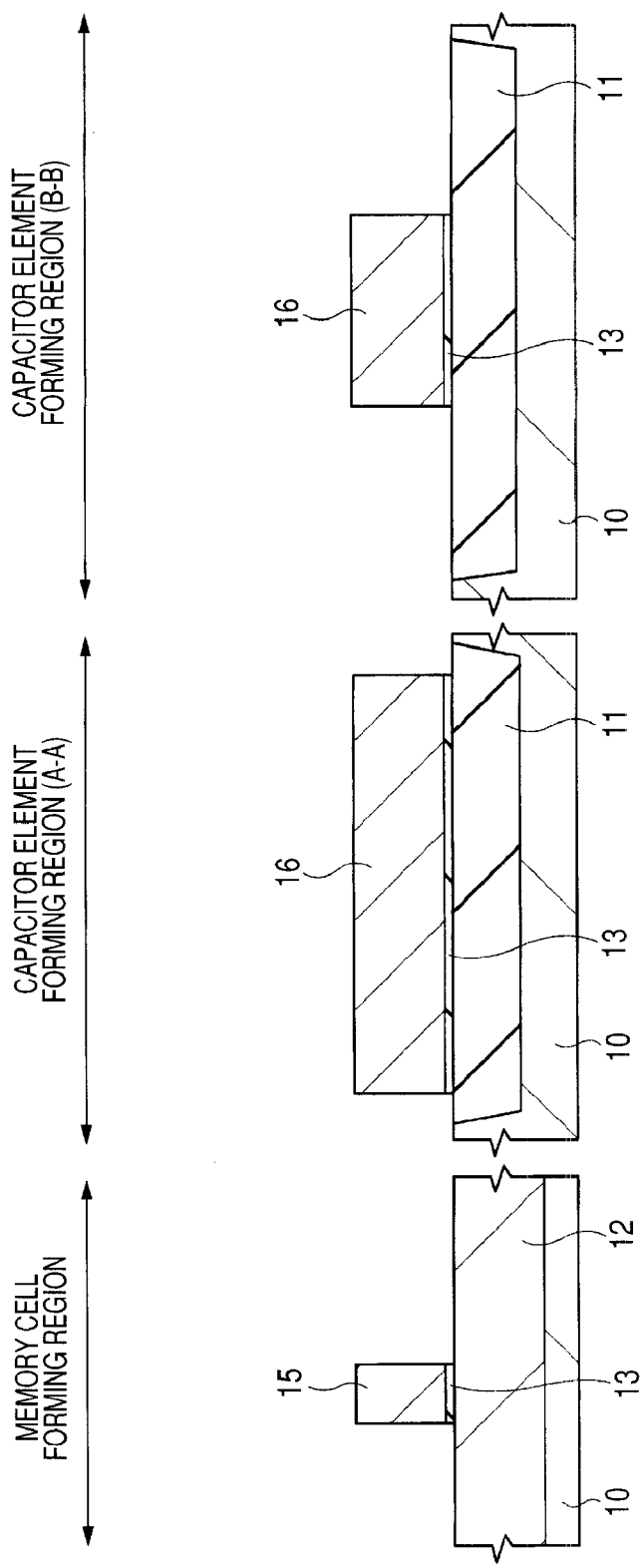
FIG. 9 is a sectional view showing the semiconductor device manufacture process in a step which follows FIG. 8.

Next, as shown in FIG. 9, the polysilicon film 14 is etched using a patterned resist film as a mask to form a control gate electrode 15 in the memory cell-forming region and a lower electrode 16 in the capacitor element-forming region. The control gate electrode 15 is a gate electrode of the select transistor in the memory cell. Thus, it is seen that the lower electrode 16 of the capacitor element is formed in the process of forming the control gate electrode 15 of the memory cell.

In the control gate electrode 15, an n-type impurity is introduced into the polysilicon film 14, so that a work function value of the control gate electrode 15 can be made a value (4.15 eV) close to the conduction band of silicon. Consequently, it is possible to decrease the threshold voltage of the select transistor which is an n-channel type MISFET.

Subsequently, though not shown, an n-type impurity such as phosphorus or arsenic is introduced to match the control gate electrode 15 with use of the photolithography technique or ion implantation method. As will be described later, this process is carried out for adjusting the threshold value of a memory transistor formed on side walls of the control gate electrode 15.

Figure 10:
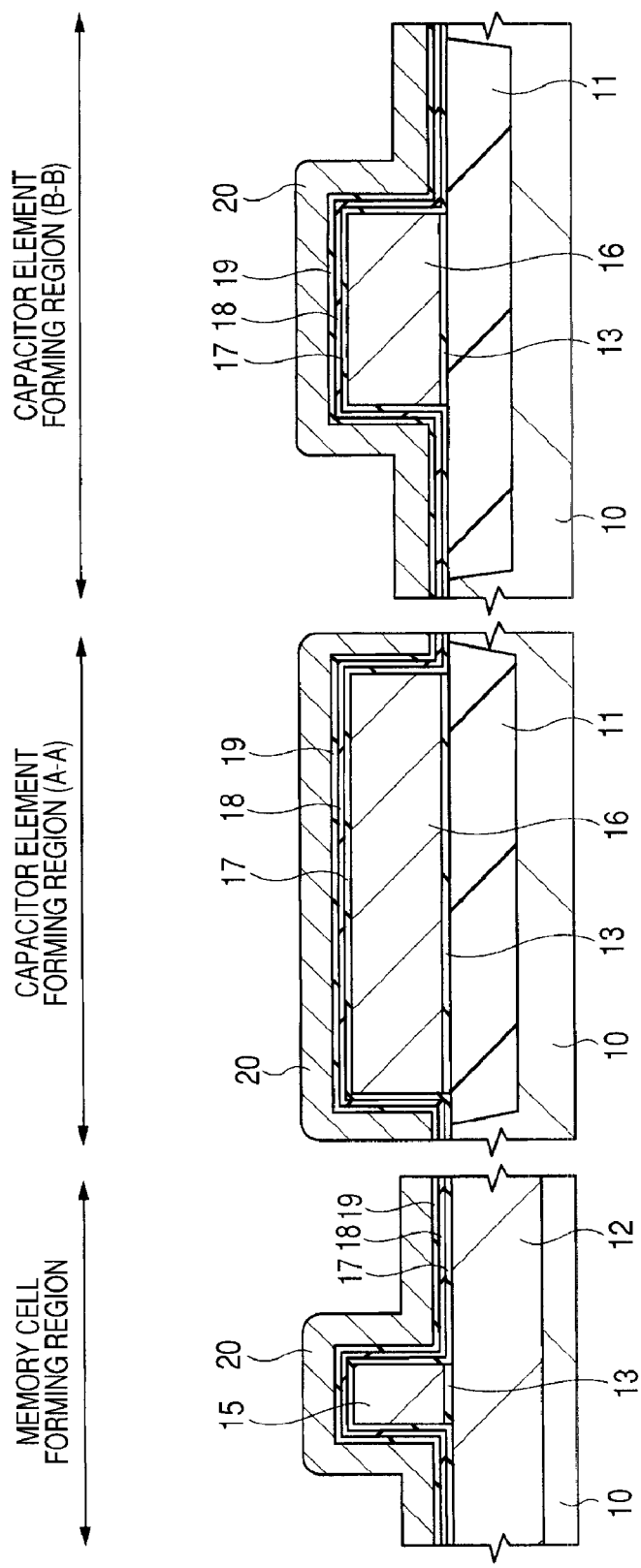
FIG. 10 is a sectional view showing the semiconductor device manufacturing process in a step which follows FIG. 9.

Next, as shown in FIG. 10, a laminate film is formed over the semiconductor substrate 10 so as to cover the control gate electrode 15 and the lower electrode 16. The laminate film is comprised of, for example, a silicon oxide film 17, a silicon nitride film 18 formed on the silicon oxide film 17, and a silicon oxide film 19 formed on the silicon nitride film 18, (ONO film). The laminate film can be formed by CVD method for example. The thickness of the silicon oxide film 17, that of the silicon nitride film 18, and that of the silicon oxide film 19, are set at, for example, 5 nm, 10 nm, and 5 nm, respectively.

In this laminate film, the silicon nitride film 18 serves as a charge storage film of the memory transistor in the memory cell-forming region. Although in this first embodiment the silicon nitride film 18 is used as the charge storage film, another insulating film having a trap level may be used as the charge storage film. For example, an aluminum oxide film (alumina film) may be used as the charge storage film. The laminate film serves as a capacitor insulating film in the capacitor element-forming region.

Then, a polysilicon film 20 is formed on the laminate film, for example, by CVD method.

Figure 11:
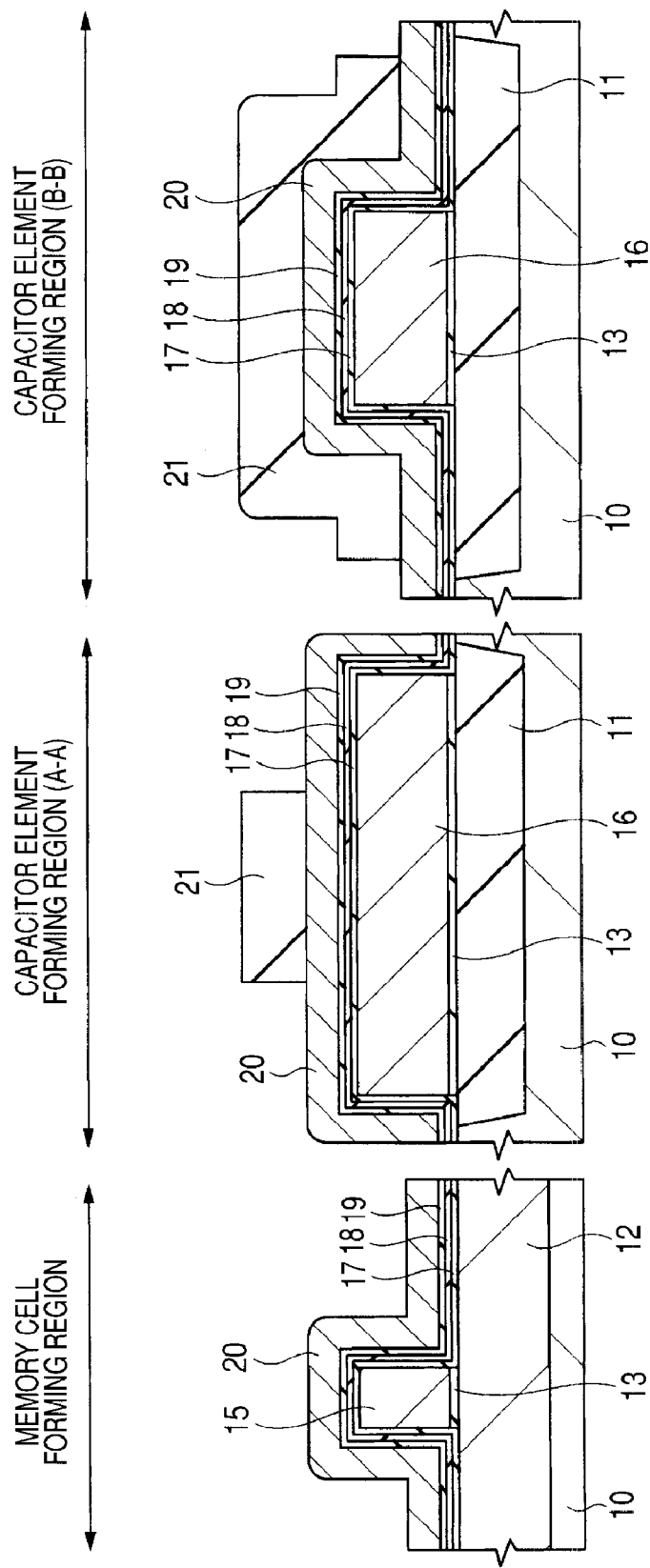
FIG. 11 is a sectional view showing the semiconductor device manufacturing process in a step which follows FIG. 10.

Next, as shown in FIG. 11, a resist film 21 is applied onto the semiconductor substrate 10 and is then subjected to exposure and development to effect patterning. The patterning is performed so as to cover the upper electrode-forming region in the capacitor element-forming region and expose the other region.

Figure 12:
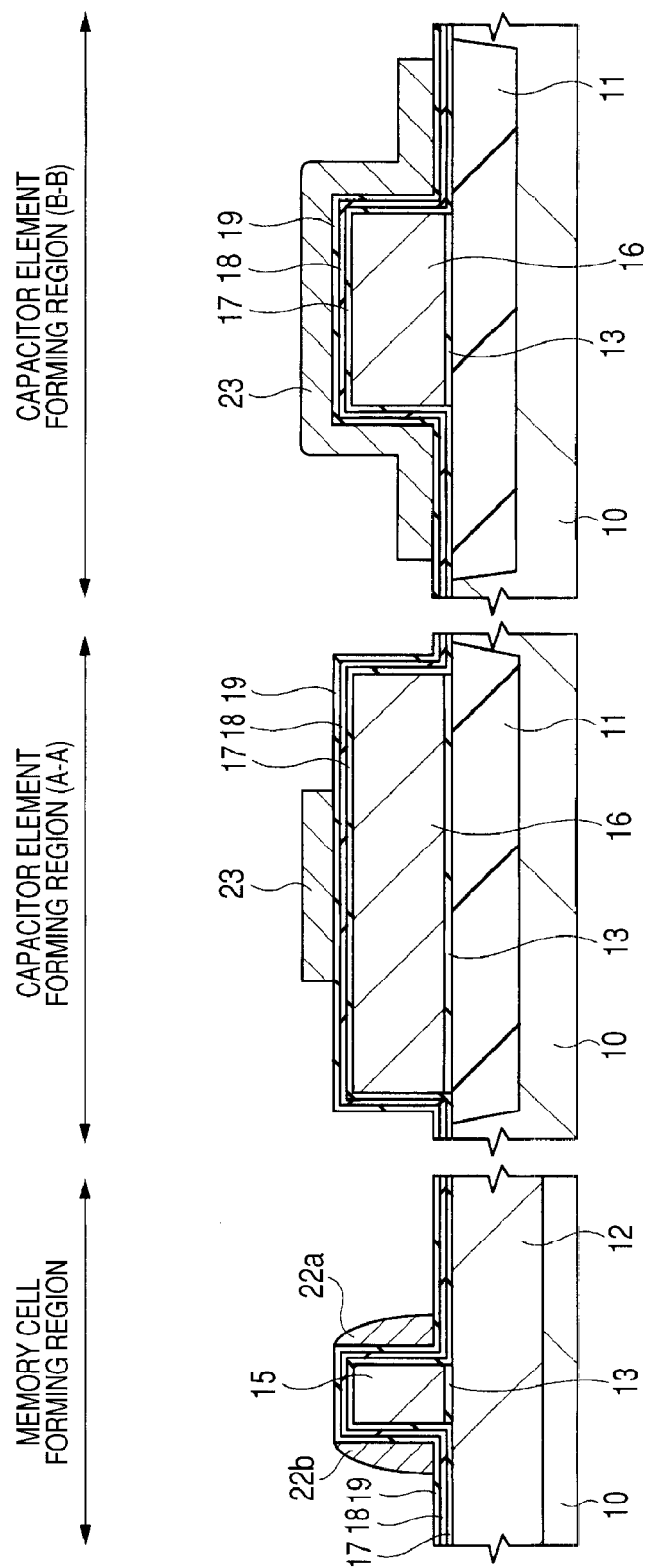
FIG. 12 is a sectional view showing the semiconductor device manufacturing process in a step which follows FIG. 11.

Subsequently, as shown in FIG. 12, the polysilicon film 20 is subjected to anisotropic etching with the resist film 21 as a mask, thereby allowing side walls 22a and 22b to remain on both side walls respectively of the control gate electrode 15. On the other hand, in the capacitor element-forming region, the polysilicon film 20 remains in only the region that has been covered with the resist film 21, and an upper electrode 23 is formed by the remaining polysilicon film 20. At this stage the upper electrode 23 is comprised of the polysilicon film 20. Thereafter, the resist film 21 after patterning is removed. In A-A section the length of the upper electrode 23 is shorter than that of the lower electrode 16, while in B-B section the length of the upper electrode 23 is larger than that of the lower electrode 16. Thus, as is seen from B-B section, there are formed a planarly overlapping region of both upper and lower electrodes 23, 16 and non-overlapping regions where the upper and lower electrodes 23, 16 do not planarly overlap each other.

Figure 13:
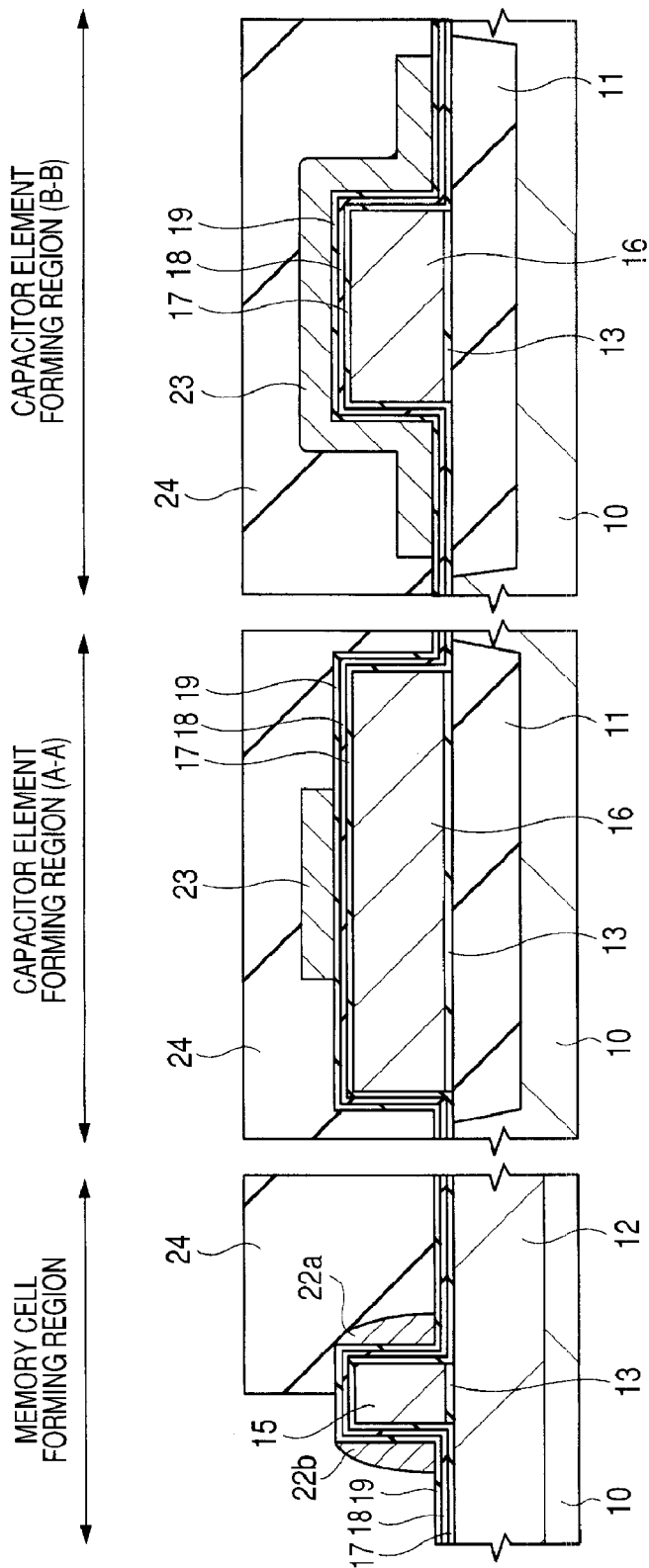
FIG. 13 is a sectional view showing the semiconductor device manufacturing process in a step which follows FIG. 12.

Then, as shown in FIG. 13, a resist film 24 is applied onto the semiconductor substrate 10 and is thereafter subjected to exposure and development to effect patterning of the resist film. The patterning is performed so as to cover the capacitor element-forming region completely and open a part of the memory cell-forming region. More specifically, the patterning is performed in such a manner that the side wall 22b formed on one side wall of the control gate electrode 15 in the memory cell-forming region is exposed. For example, in FIG. 13, the side wall 22b formed on the left side wall of the control gate electrode 15 in the memory cell-forming region is exposed.

Figure 14:
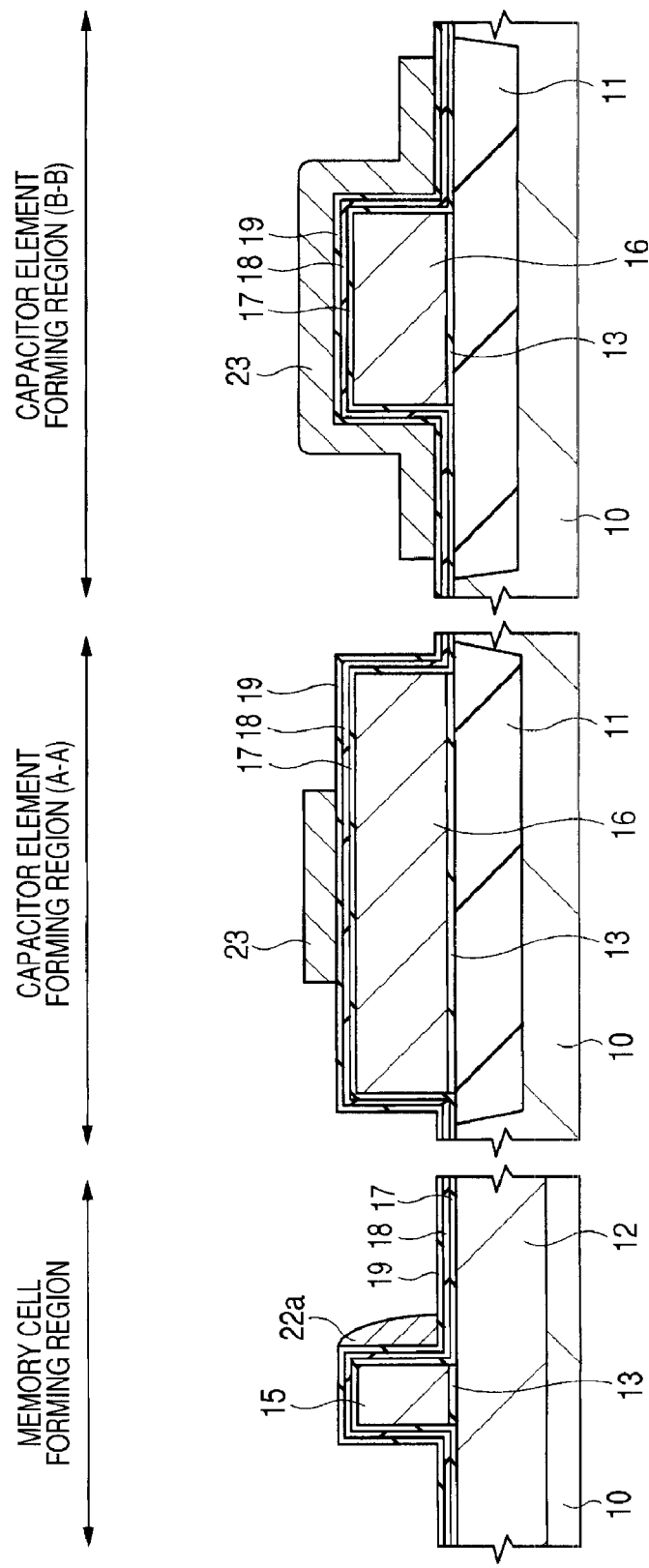
FIG. 14 is a sectional view showing the semiconductor device manufacturing process in a step which follows FIG. 13.

Next, as shown in FIG. 14, the side wall 22b exposed on the left side wall of the control gate electrode 15 is removed by etching with use of the patterned resist film 24 as a mask. At this time, the side wall 22a formed on the right side wall of the control gate electrode 15 is not removed because it is covered with the resist film 24. Also in the capacitor element-forming region the upper electrode 23 remains without being removed because it is protected by the resist film 24. Thereafter, the patterned resist film 24 is removed.

Figure 15:
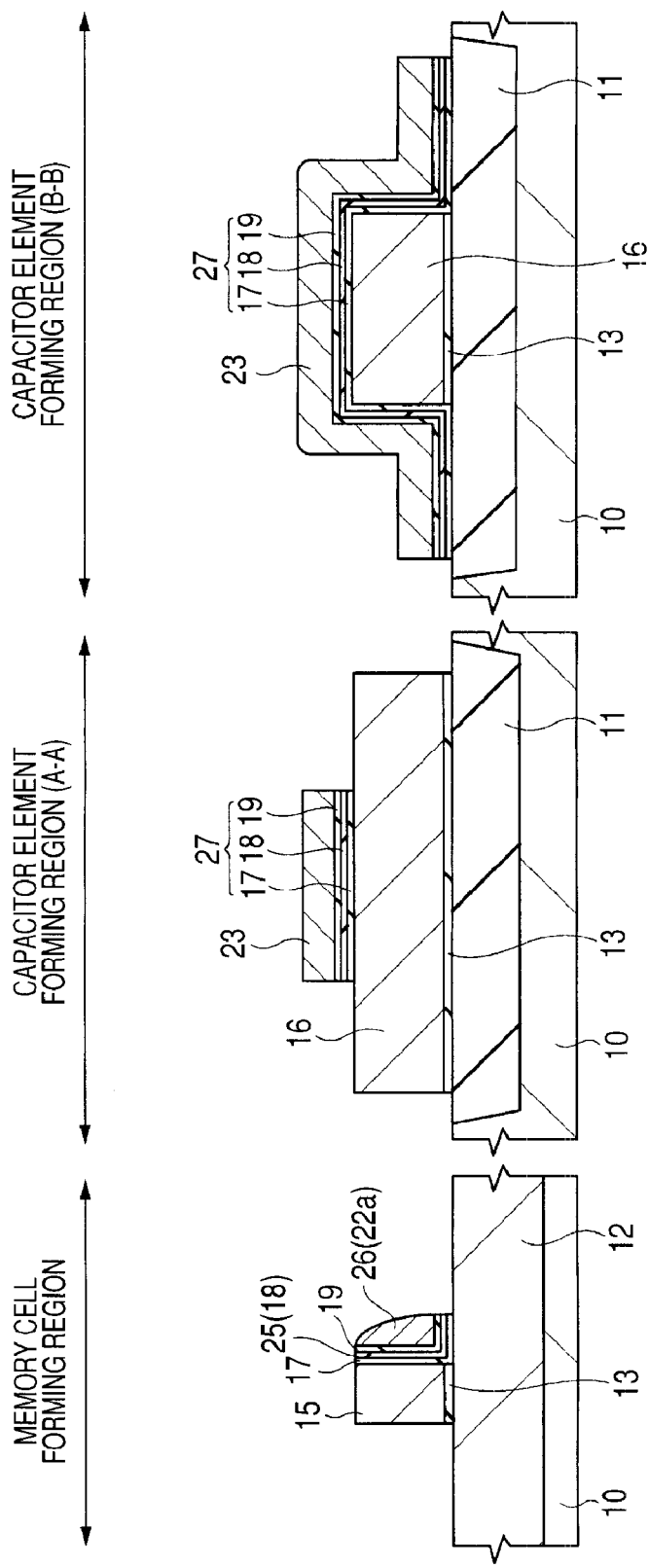
FIG. 15 is a sectional view showing the semiconductor manufacturing process in a step which follows FIG. 14.

Subsequently, as shown in FIG. 15, the exposed ONO film (laminate film) is removed by etching. In this way, in the memory cell-forming region, a memory gate electrode 26 of a side wall shape is formed on only the right side wall of the control gate electrode 15 through the laminate film (ONO film). At this time, the silicon nitride film 18 as a constituent of the laminate film (ONO film) serves as a charge storage film 25. On the other hand, in the capacitor element-forming region, only the ONO film covered with the upper electrode 23 remains and the ONO film which underlies the upper electrode 23 serves as a capacitor insulating film 27. That is, the capacitor insulating film 27 is comprised of the silicon oxide film 17, silicon nitride film 18 and silicon oxide film 19. At this stage, the memory gate electrode 26 of the memory cell and the upper electrode 23 of the capacitor element are each formed by the polysilicon film.

Figure 16:
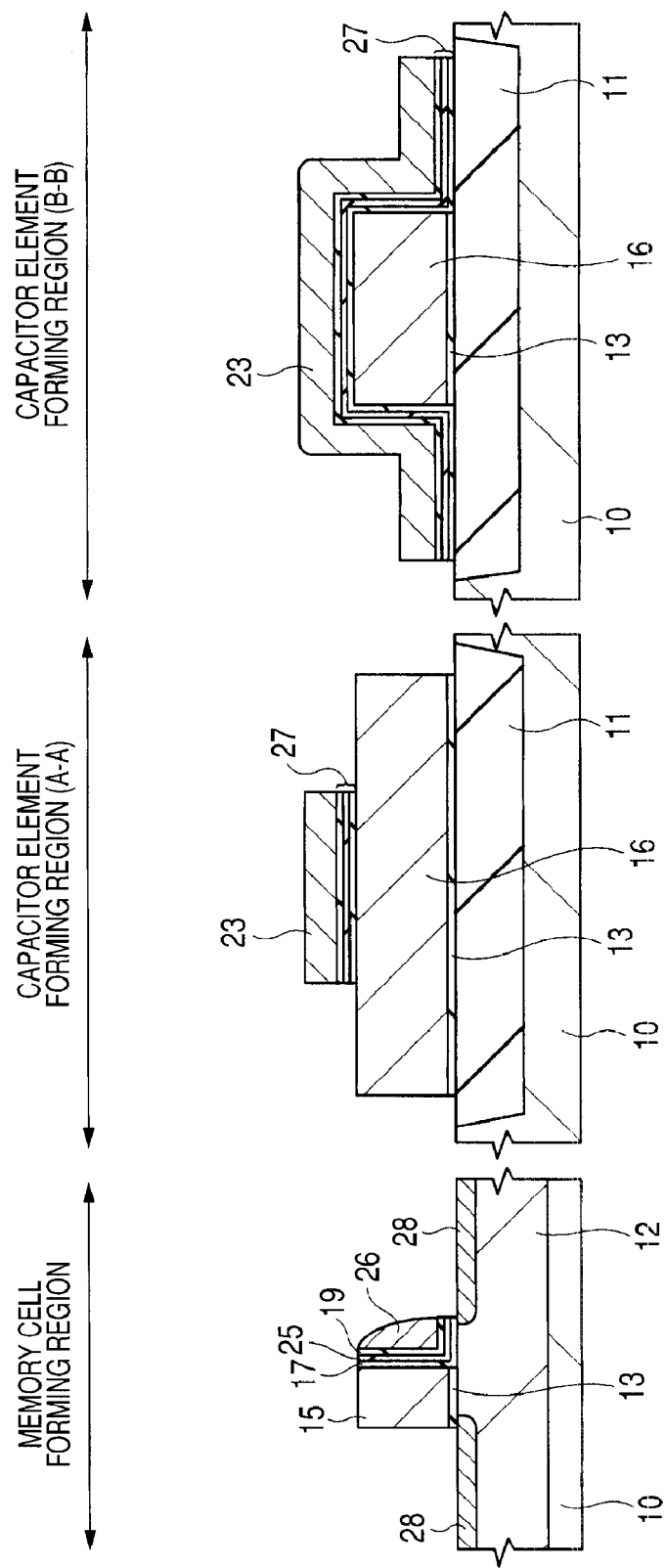
FIG. 16 is a sectional view showing the semiconductor device manufacturing process in a step which follows FIG. 15.

Next, as shown in FIG. 16, in the memory cell-forming region, shallow impurity diffusion regions 28 of a low concentration matching the control gate electrode 15 and the memory gate electrode 26, are formed with use of the photolithography technique and ion implantation method. The shallow impurity diffusion regions 28 of a low concentration are n-type semiconductor regions with an n-type impurity such as phosphorus or arsenic introduced therein.

Figure 17:
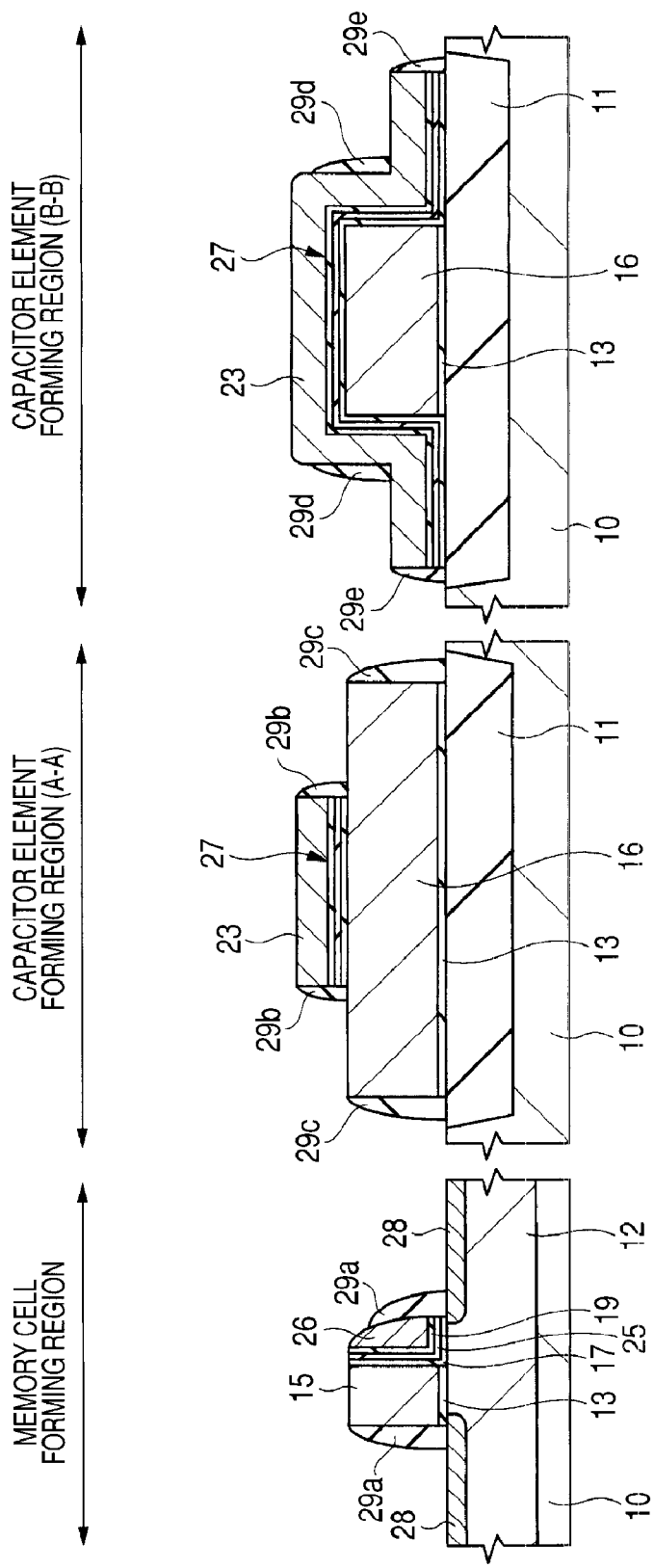
FIG. 17 is a sectional view showing the semiconductor device manufacturing process in a step which follows FIG. 16.

Then, as shown in FIG. 17, a silicon oxide film is formed on the semiconductor substrate 10, for example, by CVD method. Further, the silicon oxide film is subjected to anisotropic etching to form side walls. In the memory cell-forming region, side walls 29a are formed on the left side wall of the control gate electrode 15 and the right side wall of the memory gate electrode 24, respectively. On the other hand, in the capacitor element-forming region (A-A section), side walls 29b are formed on side walls of the upper electrode 23 and the capacitor insulating film 27 and side walls 29c are formed on side walls of the lower electrode 16. Likewise, in the capacitor element-forming region (B-B), side walls 29d are formed in stepped regions of the upper electrode 23 and side walls 29e are formed in end regions of the upper electrode 23. The side walls 29a to 29e are each formed by a single silicon oxide film, provided no limitation is made thereto. For example, a side wall comprised of a laminate of both silicon nitride film and silicon oxide film may be formed.

Figure 18:
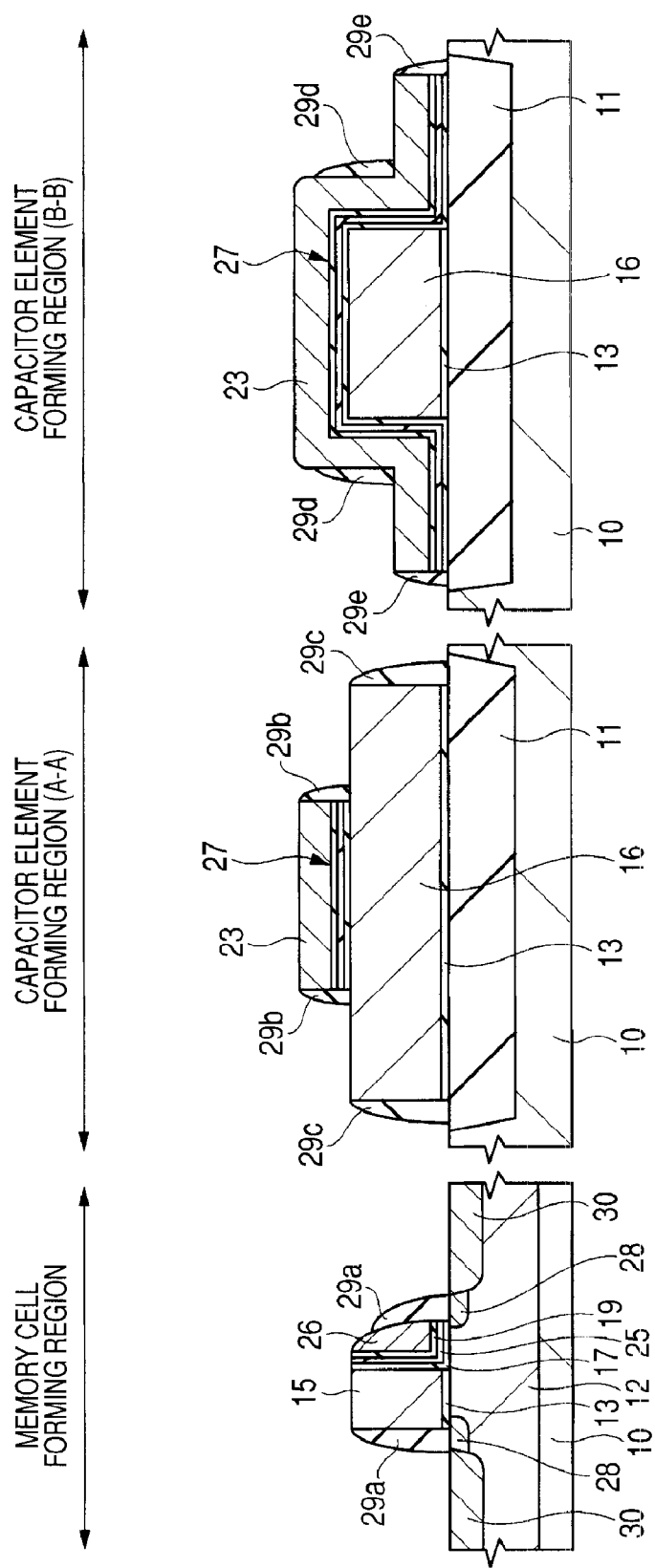
FIG. 18 is a sectional view showing the semiconductor device manufacturing process in a step which follows FIG. 17.

Next, as shown in FIG. 18, deep impurity diffusion regions 30 of a high concentration matching the side walls 29a are formed in the memory cell-forming region with use of the photolithography technique and ion implantation method. The deep impurity diffusion regions 30 of a high concentration are n-type semiconductor regions with an n-type impurity such as phosphorus or arsenic introduced therein. Source and drain regions of the memory cell are formed by the deep impurity diffusion regions 30 of a high concentration and the shallow impurity diffusion regions 28 of a low concentration. By thus forming the source and drain regions with the shallow impurity diffusion regions 28 of a low concentration and the deep impurity diffusion regions 30 of a high concentration, the source and drain regions can be made to have an LDD (Lightly Doped Drain) structure. After the impurity diffusion regions 30 of a high concentration are thus formed, there is performed a heat treatment at a temperature of about 1000° C., whereby the introduced impurity is activated.

Figure 19:
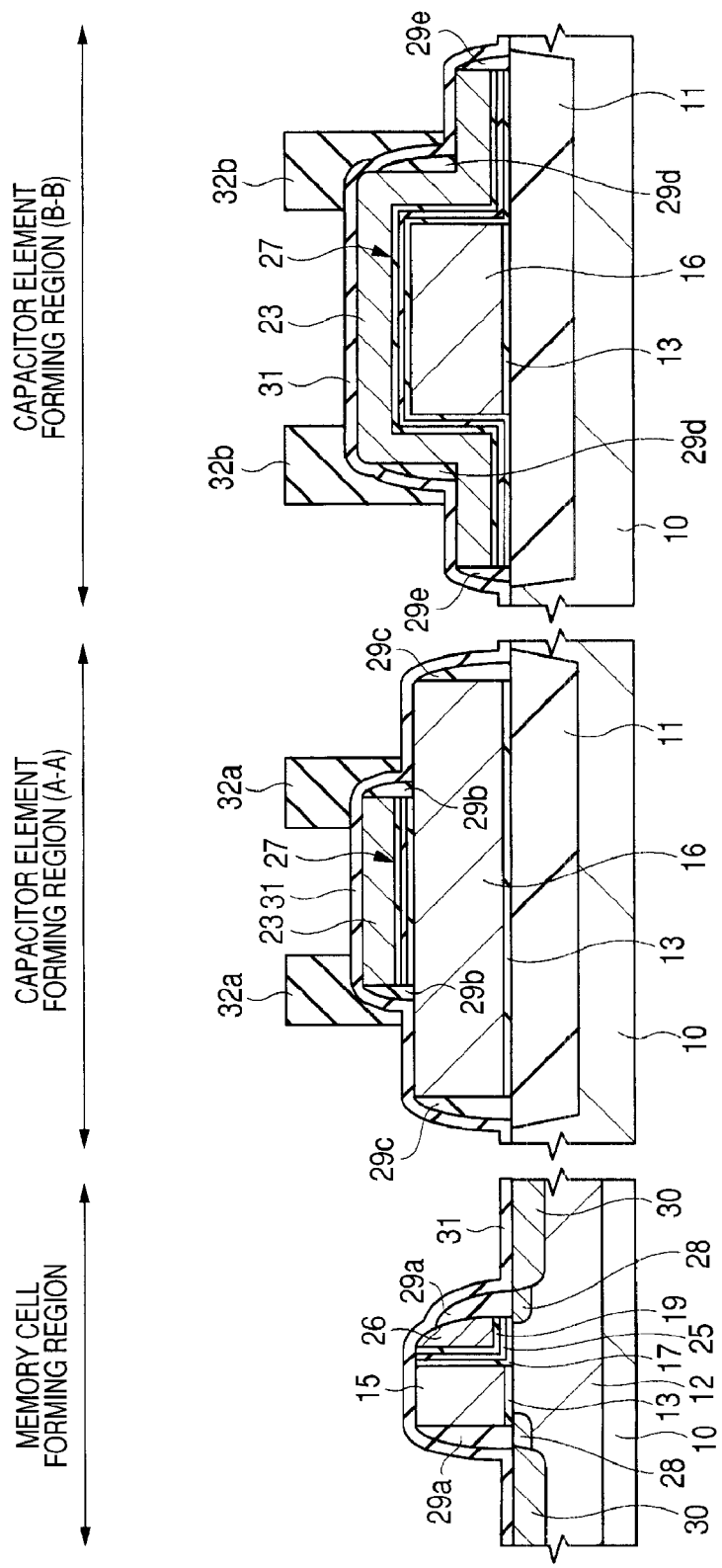
FIG. 19 is a sectional view showing the semiconductor device manufacturing process in a step which follows FIG. 18.

Subsequently, as shown in FIG. 19, a silicon oxide film 31 is formed on the semiconductor substrate 10 and a resist film is formed on the silicon oxide film 31, followed by exposure and development to effect patterning. As shown in the capacitor element-forming region (A-A section), the patterning is performed in such a manner that resist film portions 32a are allowed to remain so as to cover predetermined ranges including end regions of the upper electrode 23. Likewise, as shown in the capacitor element-forming region (B-B section), the patterning is performed in such a manner that resist film portions 32b are allowed to remain so as to cover predetermined ranges including stepped regions located at boundaries between the overlapping region and non-overlapping regions of the upper electrode 23.

Figure 20:
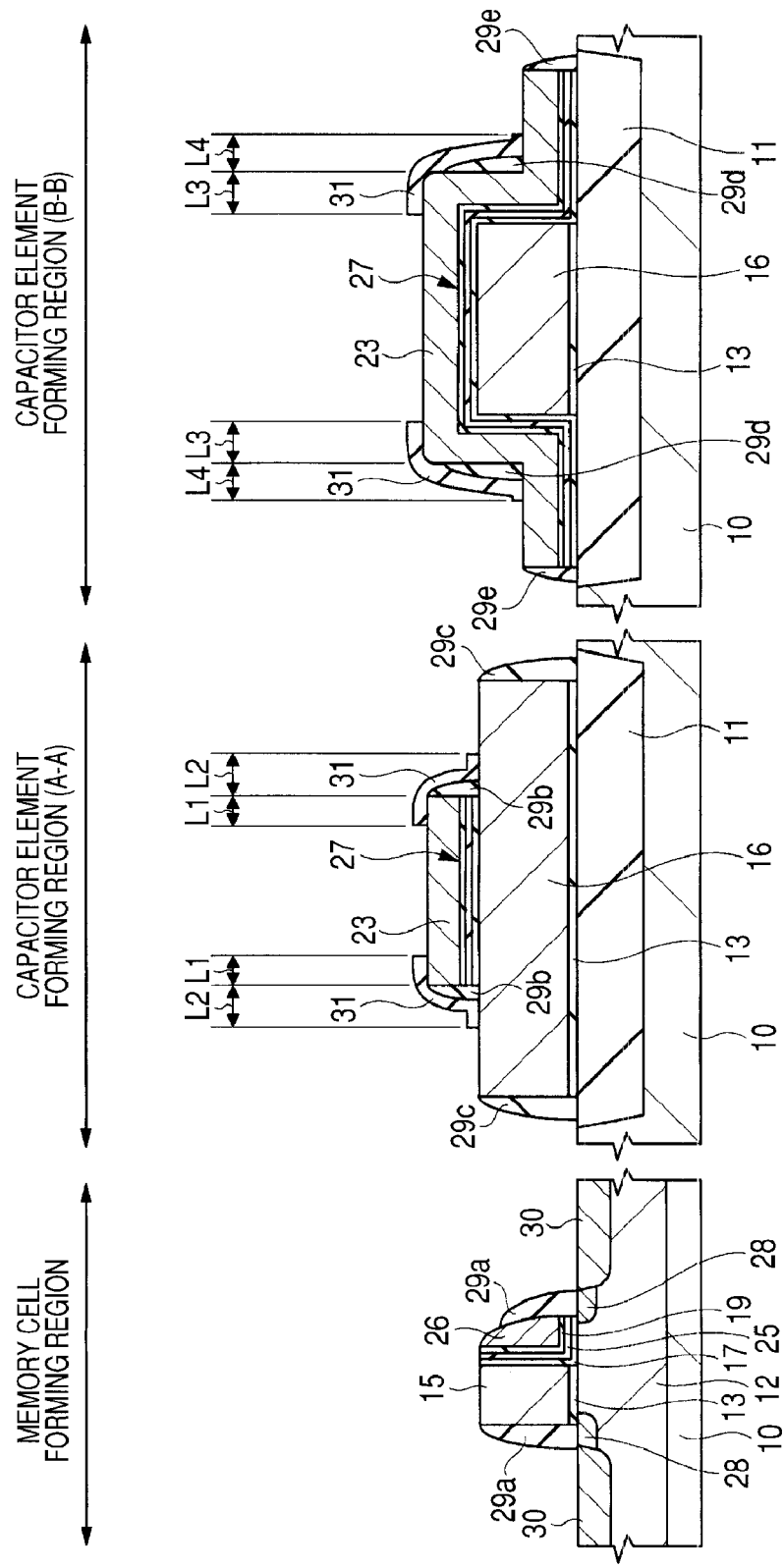
FIG. 20 is a sectional view showing the semiconductor device manufacturing process in a step which follows FIG. 19.

Thereafter, as shown in FIG. 20, etching is performed with the resist films 32a and 32b as masks to pattern the silicon oxide film 31. As a result, as shown in the capacitor element-forming region (A-A section), the silicon oxide film 31 is formed so as to cover the regions spaced apart the distance L1 from end portions of the upper electrode 23 toward the inside of the upper electrode 23 and also cover the regions spaced apart the distance L2 from end portions of the upper electrode 23 toward the side walls 29b. Further, as shown in the capacitor element-forming region (B-B section), the silicon oxide film 31 is formed so as to cover the regions spaced apart the distance L3 from the stepped regions toward the overlapping region of the upper electrode 23 and also cover the regions spaced apart the distance L4 from the stepped regions toward the non-overlapping regions (lead-out regions) of the upper electrode 23.

Figure 21:
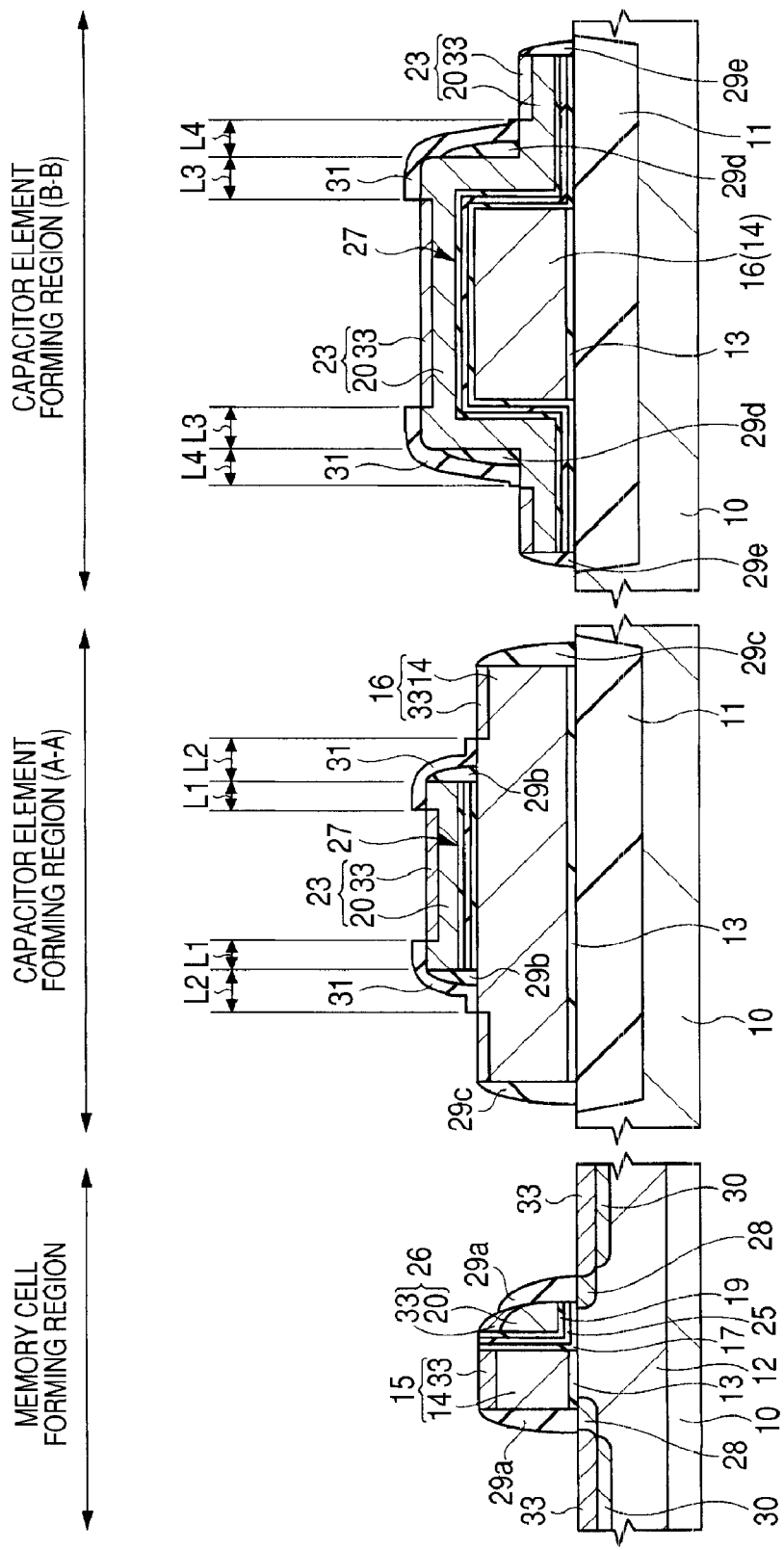
FIG. 21 is a sectional view showing the semiconductor device manufacturing process in a step which follows FIG. 20.

Next, as shown in FIG. 21, a cobalt film is formed on the semiconductor substrate 10. At this time, in the memory cell-forming region, the cobalt film is formed so as to come into direct contact with the exposed control gate electrode 15 and memory gate electrode 24. Likewise, the cobalt film comes into contact also with the deep impurity diffusion regions 30 of a high concentration. On the other hand, in the capacitor element-forming region, the cobalt film comes into direct contact with part of the lower electrode 16 and part of the upper electrode 22, provided the cobalt film is put in direct contact with neither the regions spaced apart the distance L1 from end portions of the upper electrode 23 toward the inside of the upper electrode nor the regions spaced apart the distance L2 from end portions of the upper electrode 23 toward the side walls 29b because these regions are covered with the silicon oxide film 31. Likewise, the cobalt film is put in direct contact with neither the regions spaced apart the distance L3 from the stepped regions toward the overlapping region of the upper electrode 23 nor the regions spaced apart the distance L4 from the stepped regions toward the non-overlapping regions (lead-out regions) of the upper electrode 23 because these regions are covered with the silicon oxide film 31. The cobalt film can be formed, for example, by sputtering. The thickness of the cobalt film is, for example, 10 nm.

Then, a first heat treatment is performed for the semiconductor substrate 10 and thereafter the surface of the semiconductor substrate 10 is cleaned. This cleaning is done by both APM (Ammonium hydroxide hydrogen Peroxide Mixture) cleaning and HPM cleaning. APM cleaning uses a mixed solution consisting of ammonium hydroxide ($NH_4OH$), hydrogen peroxide ($H_2O_2$) and pure water ($H_2O$), which is highly effective in removing particles and organic matters. On the other hand, HPM cleaning uses a mixed solution consisting of hydrochloric acid (HCl), hydrogen peroxide ($H_2O_2$) and pure water ($H_2O$), which is highly effective in removing metals. After the cleaning, a second heat treatment is performed. As a result, in the memory cell-forming region, as shown in FIG. 21, the polysilicon films 14 and 20 which configure the control gate electrode 15 and the memory gate electrode 26, respectively, and the cobalt film are reacted with each other to form a cobalt silicide film 31. Consequently, the control gate electrode 15 and the memory gate electrode 26 become laminates of the polysilicon films 14, 20, respectively, and the cobalt silicide film 31. The cobalt silicide film 31 is formed for making the control gate 15 and the memory gate electrode 26 low in resistance. Likewise, by the above heat treatment, also on the surface of the impurity diffusion regions 30 of a high concentration, silicon and the cobalt film react with each other to form a cobalt silicide film 33. Consequently, it is possible to attain a low resistance also in the impurity diffusion regions 30 of a high concentration.

On the other hand, in the capacitor element-forming region, a cobalt silicide film 33 is formed in part of the upper electrode 23 and also in part of the lower electrode 16 whose surfaces are not covered with the silicon oxide film 31. In the region covered with the silicon oxide film 31 the cobalt silicide film 33 is not formed because the silicidation reaction does not proceed. For example, in the capacitor element-forming region (A-A section), the cobalt silicide film 33 is formed neither in the regions spaced apart the distance L1 from end portions of the upper electrode 23 toward the inside of the upper electrode nor in the regions spaced apart the distance L2 from end portions of the upper electrode 3 toward the side walls 29b. Therefore, at the end portions of the upper electrode 23 it is possible to prevent abnormal growth of the cobalt silicide film 33 because the same film is not present. Consequently, it is possible to prevent a short-circuit defect between the upper electrode 23 and the lower electrode 16 which is caused by abnormal growth of the cobalt silicide film 33.

Further, for example in the capacitor element-forming region (B-B section), the cobalt silicide film 33 is formed neither in the regions spaced apart the distance L3 from the stepped regions toward the overlapping region of the upper electrode 23 nor in the regions spaced apart the distance L4 from the stepped regions toward the non-overlapping regions (lead-out regions) of the upper electrode. Therefore, it is possible to eliminate the influence caused by field concentration in the stepped regions and the influence of a shorter distance between the cobalt silicide film 33 and the capacitor insulating film 27. Thus, in the PIP capacitor element according to this first embodiment it is possible to prevent dielectric breakdown of the capacitor insulating film 27.

Unreacted cobalt film is removed from the surface of the semiconductor substrate 10. Although the cobalt silicide film 33 is formed in this first embodiment, it may be substituted by, for example, a nickel silicide film or a titanium silicide film.

In the manner described above it is possible to form the memory cell in the memory cell-forming region and also form the PIP capacitor element according to this first embodiment in the capacitor element-forming region.

Next, a wiring process will be described with reference to FIG. 6. As shown in the same figure, an interlayer insulating film 34 is formed on a main surface of a semiconductor substrate 10. The interlayer insulating film 34 is formed, for example, by a silicon oxide film. For example, it can be formed by CVD method using TEOS (tetra ethyl ortho silicate) as a raw material. Thereafter, the surface of the interlayer insulating film 34 is planarized, for example, by CMP (Chemical Mechanical Polishing) method.

Subsequently, contact holes 35 are formed in the interlayer insulating film 34 with use of photolithography technique and etching technique. Plural contact holes 35 are formed in the memory cell-forming region and the capacitor element-forming region. Then, a titanium/titanium nitride film 36a is formed on the interlayer insulating film 34, including bottoms and inner walls of the contact holes 35. The titanium/titanium nitride film 36a is comprised of a laminate of both titanium film and titanium nitride film and it can be formed, for example, by sputtering. The titanium/titanium nitride film 36a functions as a so-called barrier for example to prevent tungsten as the material of a film to be buried in a later process from being diffused into silicon.

Then, a tungsten film 36b is formed throughout the whole of the main surface of the semiconductor substrate 10. For example, it can be formed by CVD method. Further, unnecessary titanium/titanium nitride film 36a and tungsten film 36b formed on the interlayer insulating film 34 are removed, for example, by CMP method, whereby plugs 37a to 37c can be formed.

Next, a titanium/titanium nitride film 38a, an aluminum film 38b containing copper, and a titanium/titanium nitride film 38c are formed in this order onto the interlayer insulating film 34 and the plugs 37a to 37c. These films can be formed, for example, by sputtering. Subsequently, these films are subjected to patterning with use of photolithography technique and etching technique to form wiring lines HL1, HL2 and HL3. Further, wiring is formed over wiring, but an explanation on this point will here be omitted. In this way it is possible to eventually fabricate the semiconductor device according to this first embodiment.

Second Embodiment

In the above first embodiment a description has been given about a single PIP capacitor element, while in this second embodiment a description will be given about using an upper electrode in common for plural PIP capacitor elements.

Figure 22:
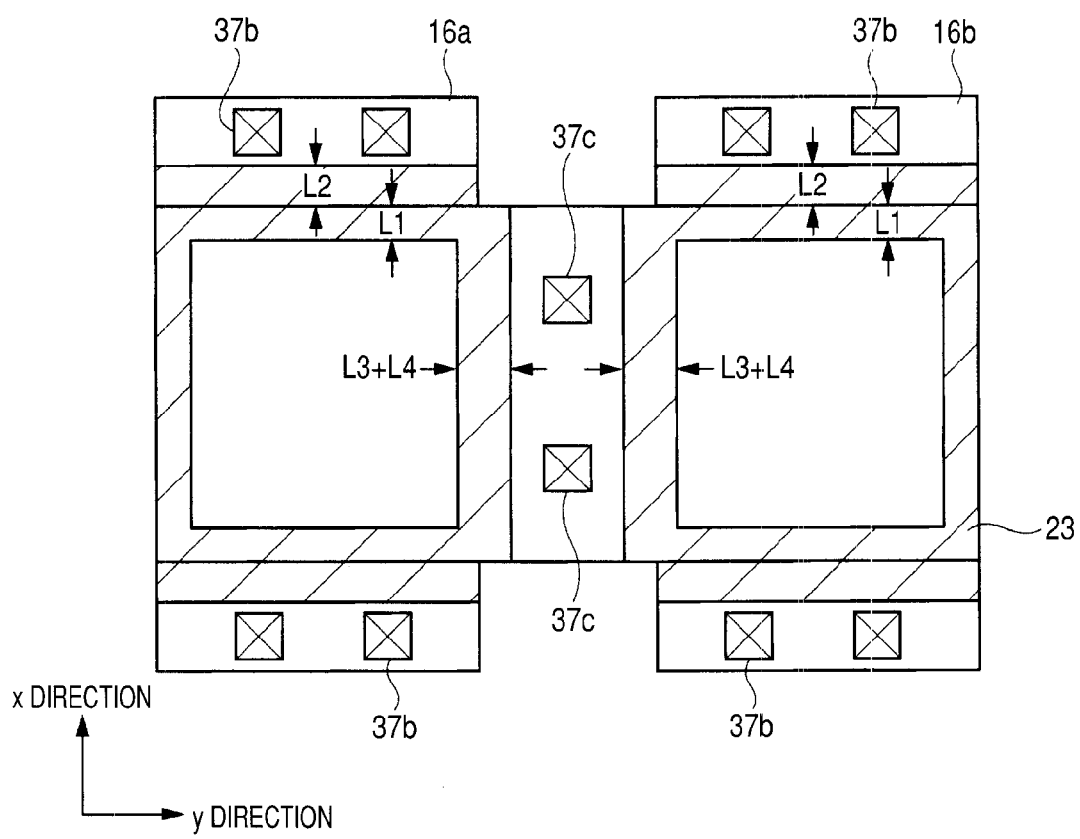
FIG. 22 is a plan view showing the configuration of a capacitor element in a second embodiment of the present invention.

FIG. 22 is a plan view showing a PIP capacitor element according to this second embodiment. In the same figure, a lower electrode (first lower electrode) 16a and a lower electrode (second lower electrode) 16b are arranged side by side spacedly in y direction and a common upper electrode 23 is formed over the lower electrodes 16a and 16b.

The lower electrodes 16a and 16b have the same rectangular shape. On the other hand, the lower electrodes 16a, 16b and the upper electrode 23 are in rectangular shapes different from each other and have planarly overlapping regions and planarly non-overlapping regions. As shown in FIG. 22, the lower electrodes 16a and 16b are each longer than the upper electrode 23 in x direction, while in y direction (direction intersecting the x direction) the length of the upper electrode 23 is larger than the sum of the length of the lower electrode 16a and that of the lower electrode 16b. One PIP capacitor element is formed in a planarly overlapping region of the lower electrode 16a and the upper electrode 23 thus configured. Likewise, one PIP capacitor element is formed in a planarly overlapping region of the lower electrode 16b and the upper electrode 23. Thus, in FIG. 22 there are formed two PIP capacitor elements and the upper electrode 23 is common to those PIP capacitor elements. In the non-overlapping regions of the lower electrodes 16a and 16b there are formed plugs 37b which are coupled electrically to the lower electrode 16a or 16b, while in the non-overlapping region of the upper electrode 23 there are formed plugs 37c coupled electrically to the upper electrode 23.

As shown in FIG. 22, in the PIP capacitor element according to this second embodiment, the non-overlapping region (lead-out region) which configures a part of the upper electrode 23 is formed on only one side with respect to each of the lower electrodes 16a and 16b. This point is different from the previous first embodiment. By thus making he lead-out region (non-overlapping region) common on one side of each of the lower electrodes 16a and 16b there is obtained an effect that the area occupied by the PIP capacitor elements can be reduced. Moreover, by coupling plural PIP capacitor elements in parallel, a PIP capacitor element of a large capacity can be realized by a small occupancy area. Plural PIP capacitor elements can be coupled in parallel by making the separated lower electrodes 16a and 16b equal in potential. On the other hand, as to the upper electrode 23, it is inevitably at the same potential because it is made common.

Also in the PIP capacitor elements thus configured there arises the same problem as in the previous first embodiment because the basic configuration thereof is the same as in the first embodiment. Therefore, the same configuration as in the first embodiment is adopted also in this second embodiment. In FIG. 22, hatched regions defined by distances L1 and L2 are shown in boundary regions between the upper electrode 23 and the lower electrodes 16a, 16b. Further, hatched regions defined by distances L3+L4 are shown in boundary regions (stepped regions) between overlapping regions and non-overlapping region of the upper electrode 23. A cobalt silicide film is not formed in these hatched regions and this point is a feature of this second embodiment. Consequently, as in the first embodiment, it is possible to prevent the occurrence of a short-circuit defect caused by creeping up of the cobalt silicide film from end regions of the upper electrode 23 and reaching the surface of the lower electrode 16 and also prevent dielectric breakdown of the capacitor insulating film caused by field concentration in the stepped regions of the upper electrode 23.

The method for forming the PIP capacitor elements in this second embodiment is the same as in the previous first embodiment except that a change is made to a mask for implementing such a layout configuration as shown in FIG. 22.

Third Embodiment

Although in the first embodiment there is shown an example of forming the PIP capacitor element on the element isolation region, in this third embodiment a description will be given about a configuration wherein plural PIP capacitor elements are stacked on an electrically conductive semiconductor substrate.

Figure 23:
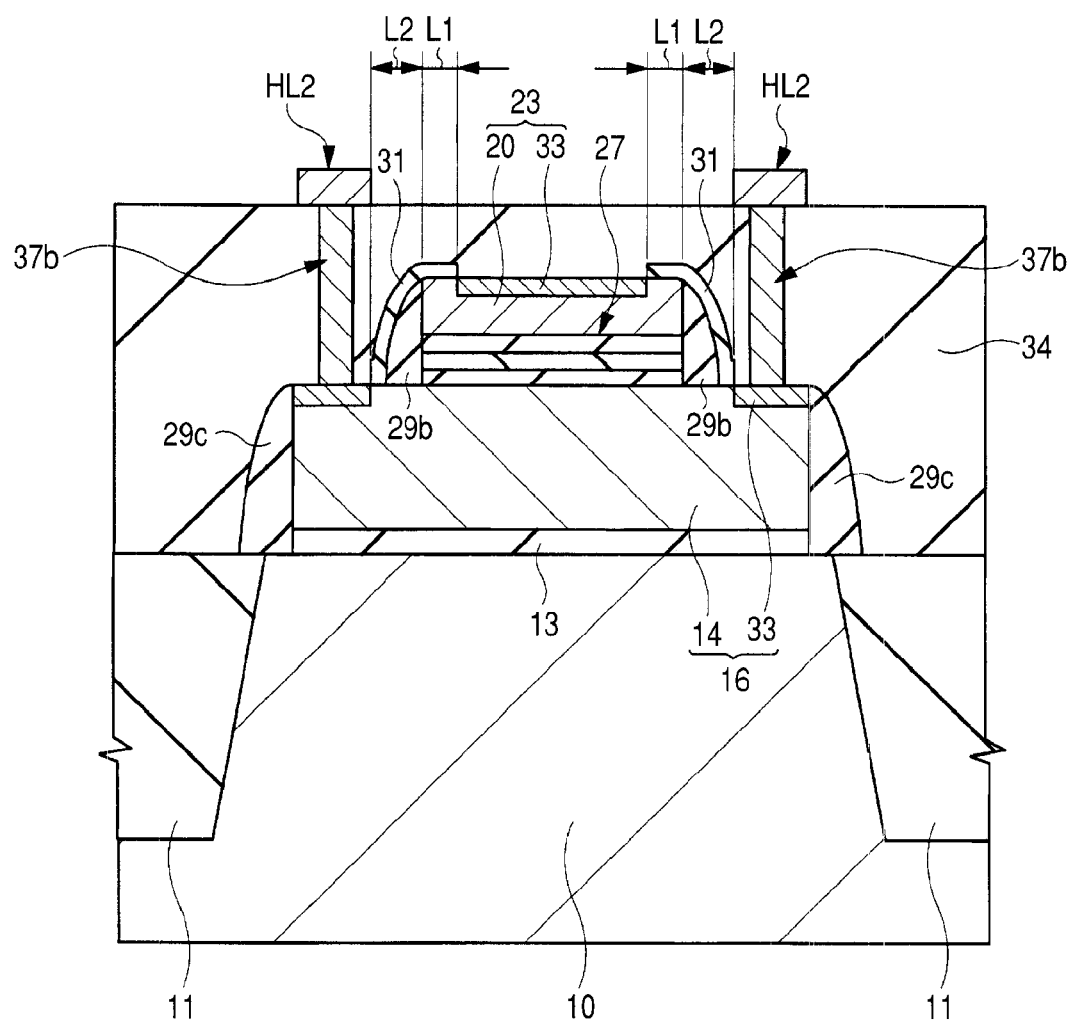
FIG. 23 is a sectional view showing the configuration of a capacitor element in a third embodiment of the present invention.
Figure 24:
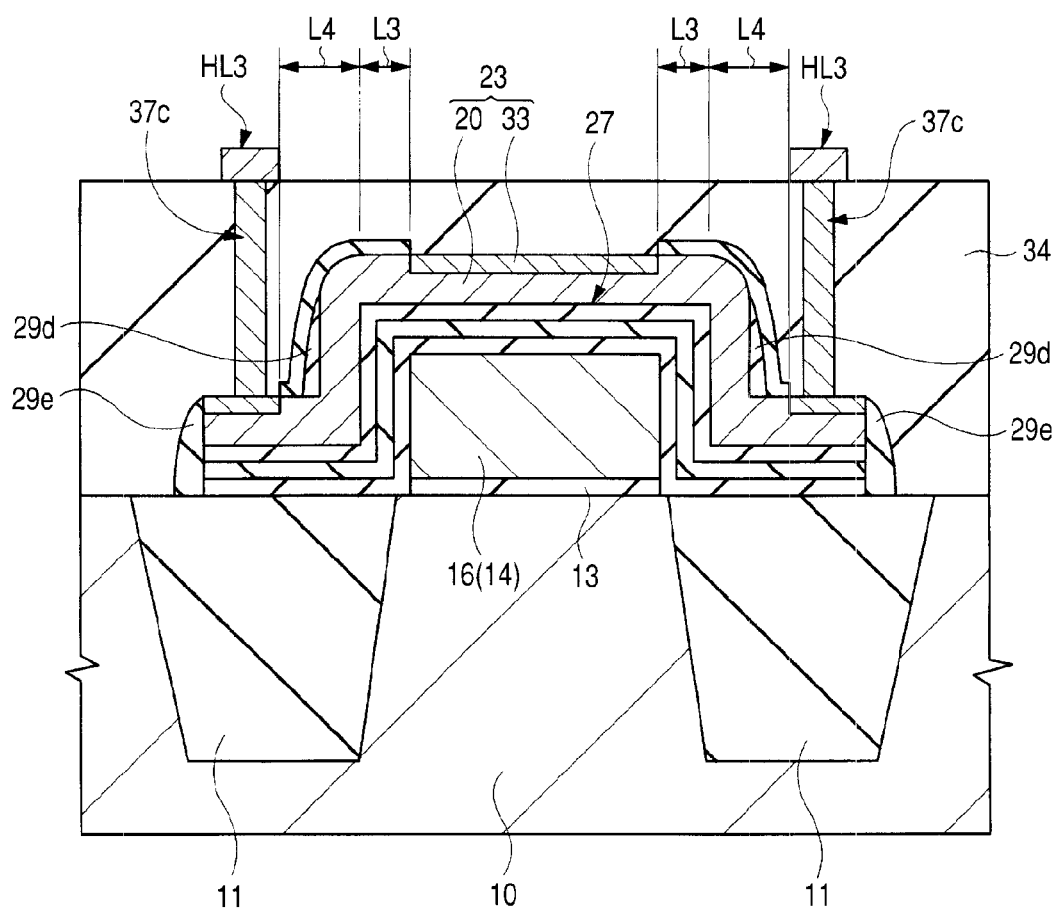
FIG. 24 is a sectional view showing the configuration of the capacitor element in the third embodiment.
Figure 25:
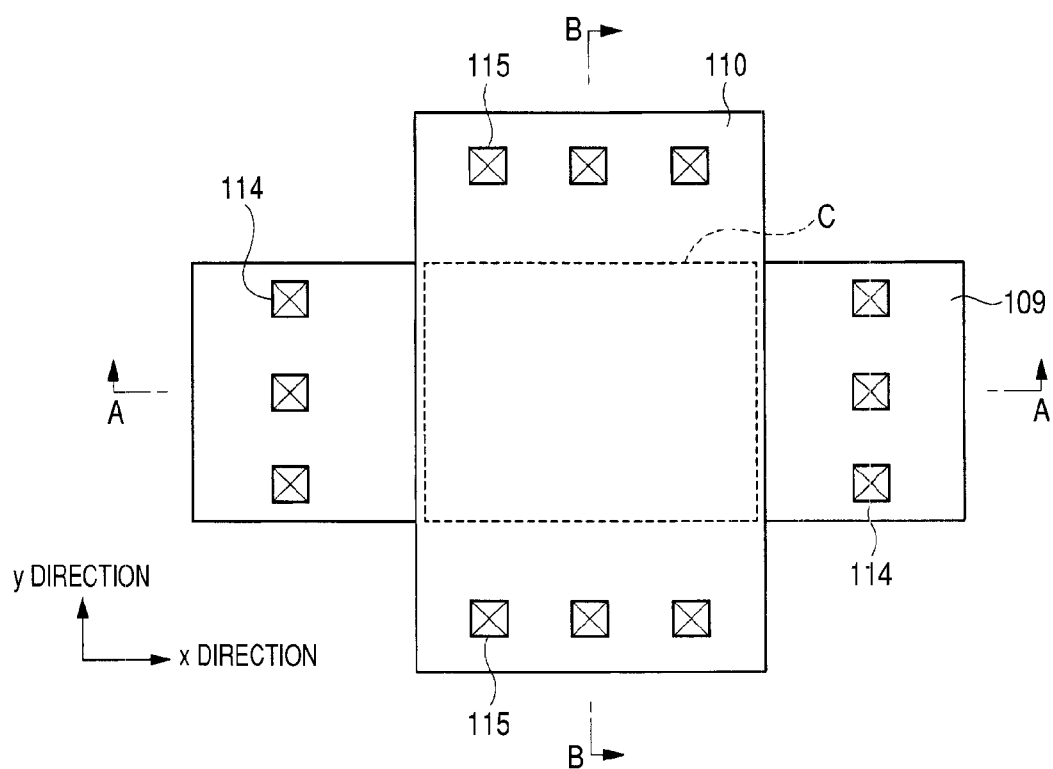
FIG. 25 is a plan view showing the configuration of a capacitor element which the present inventors have studied.
Figure 26:
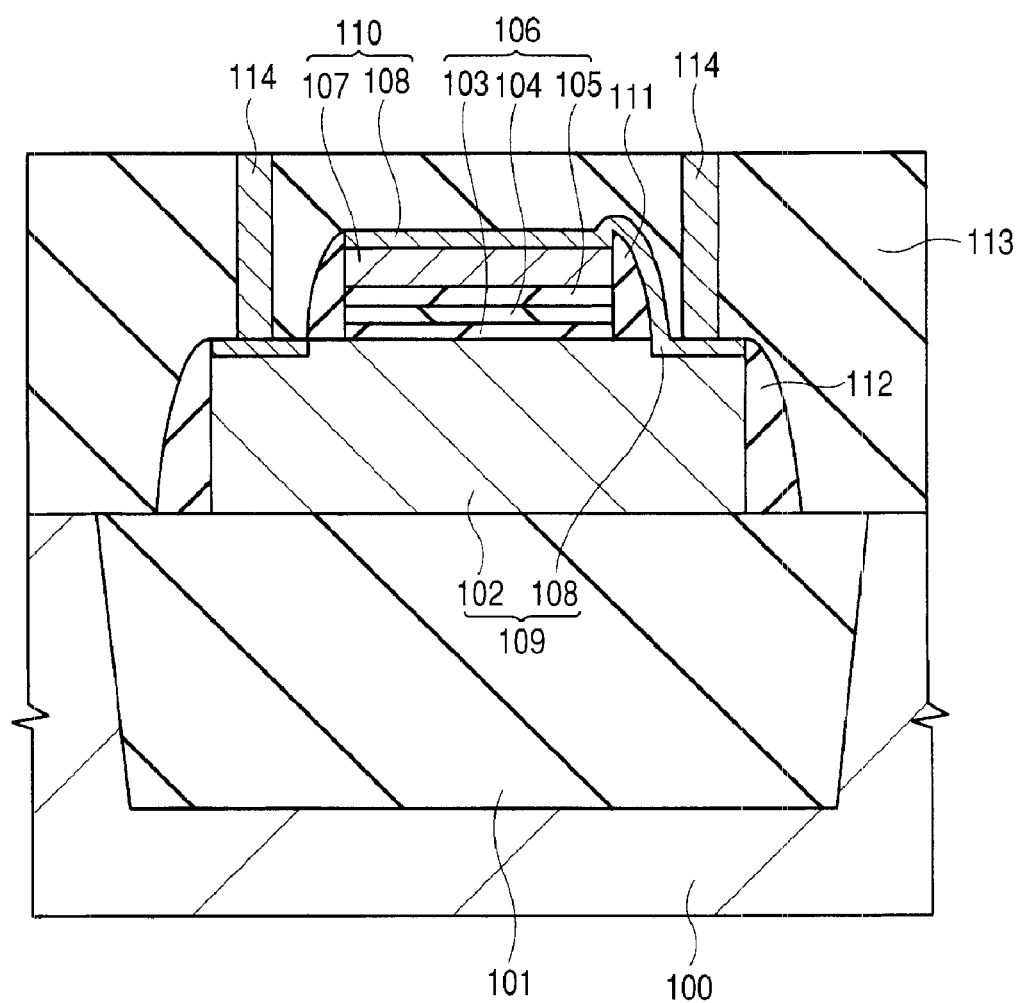
FIG. 26 is a sectional view taken on line A-A in FIG. 25.
Figure 27:
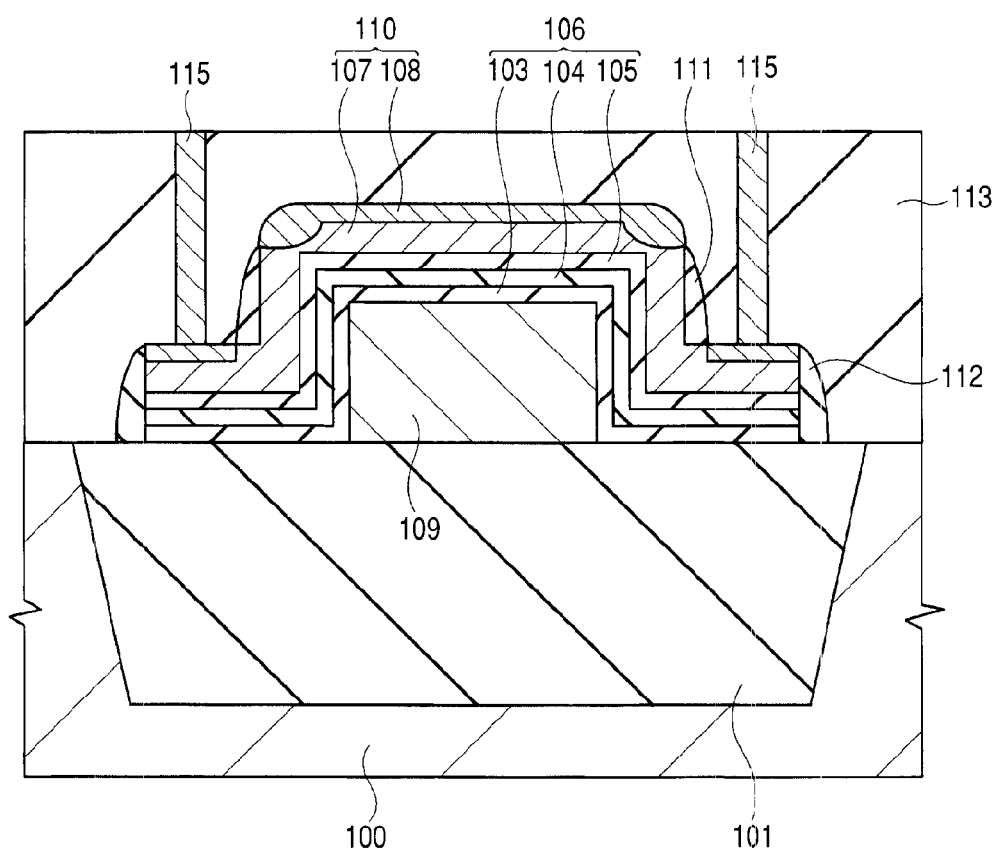
FIG. 27 is a sectional view taken on line B-B in FIG. 25.

The planar layout of PIP capacitor elements in the second embodiment is the same as that shown in FIG. 2 which shows the planar layout of PIP capacitor element in the first embodiment. A different point between this third embodiment and the first embodiment appears in sectional views. FIG. 23 is a sectional view of a PIP capacitor element in this third embodiment, which corresponds to the A-A section of FIG. 2. FIG. 14 is a sectional view of the PIP capacitor element in this third embodiment, which corresponds to the B-B section of FIG. 2. As shown in FIGS. 23 and 24, element isolation regions 11 are formed on a semiconductor substrate 10 and a PIP capacitor element is formed in an active region sandwiched in between the element isolation regions 11. That is, the PIP capacitor element in this third embodiment includes a first capacitor element, the first capacitor element including the semiconductor substrate as a first electrode and a lower electrode 16 as a second electrode, the lower electrode 16 being formed on the semiconductor substrate through a gate insulating film 13. The gate insulating film 13 serves as a capacitor insulating film of the first capacitor element.

Further, an upper electrode 23 is formed on the lower electrode 16 (second electrode) through a capacitor insulating film 27, thus configuring a second capacitor element comprising the lower electrode 16, capacitor insulating film 27 and upper electrode 23 (third electrode). In this way, in this third embodiment the first and second capacitor elements are formed in a vertically stacked fashion. Thus, by coupling the first and second capacitor elements in parallel it is possible to form a PIP capacitor element of a large capacitance value at an occupancy area equal to that in the first embodiment. Parallel coupling between the first and second capacitor elements can be implemented by making the semiconductor substrate 10 and the upper electrode 23 equal in potential.

Also in the PIP capacitor element thus configured there arise the same problem as in the first embodiment because the basic configuration thereof is the same as in the firs embodiment. Therefore, also in this third embodiment there is adopted the same configuration as in the first embodiment. That is, as shown in FIG. 23, end portions of a cobalt silicide film 33 formed on the upper electrode 23 are spaced apart the distance L1 from end portions of the upper electrode 23. According to this configuration there is obtained an effect that it is possible to prevent the cobalt silicide film 33 from reaching the end portions of the upper electrode 23 and creeping out to side walls 29b. Besides, end portions of the cobalt silicide film 33 are spaced apart the distance L2 from boundaries between the upper electrode 23 and the lower electrode 16. Consequently, even if the cobalt silicide film 33 grows abnormally and creeps out to the side walls 29b, it is possible to prevent contact between the cobalt silicide film 33 creeping out along the side walls 29b and the cobalt silicide film formed on the lower electrode 16, because the cobalt silicide film 33 formed on the lower electrode 16 is spaced apart from the side walls 29b.

Further, as shown in FIG. 24, the cobalt silicide film 33 is formed neither in the ranges of distance L3 from stepped regions formed in the upper electrode 23 toward the overlapping region nor in the ranges of distance L4 from the stepped regions toward the non-overlapping regions (side walls 29d-forming regions). Thus, since the cobalt silicide film 33 is not formed on upper end portions of the stepped regions, it is possible to eliminate the influence caused by field concentration in the stepped regions and the influence of a shorter distance between the cobalt silicide film 33 and the capacitor insulating film 27. Therefore, according to the PIP capacitor element in this third embodiment it is possible to prevent dielectric breakdown of the capacitor insulating film 27.

The method for forming the PIP capacitor element in this third embodiment is the same as in the first embodiment except that the PIP capacitor element is formed on an active region sandwiched in between element isolation regions.

Although the present invention has been described above concretely, it goes without saying that the present invention is not limited to the above embodiments and that various changes may be made within the scope not departing from the gist of the invention.

The present invention is widely applicable to the semiconductor device manufacturing industry.

What is claimed is:

1. A semiconductor device comprising:
   (a) a semiconductor device;
   (b) a first capacitor element formed over the semiconductor substrate; and
   (c) a second capacitor element formed over the first capacitor element,
   the first capacitor element including:
   (b1) a first electrode comprising the semiconductor substrate;
   (b2) a first capacitor insulating film formed over the first electrode; and
   (b3) a second electrode formed over the first capacitor insulating film,
   the second capacitor element including:
   (c1) the second electrode;
   (c2) a second capacitor insulating film formed over the second electrode; and
   (c3) a third electrode formed over the second capacitor insulating film,
   wherein the length of the third electrode in a first direction is larger than that of the second electrode in the first direction, the length of the third electrode in a second direction intersecting the first direction is smaller than the length of the second electrode in the second direction,
   wherein the first capacitor element is formed in a region where the semiconductor substrate and the second electrode overlap each other planarly, the second capacitor element is formed in a region where he second electrode and the third electrode overlap each other planarly,
   wherein over a surface of the third electrode, there exist a region where a metal silicide film is formed, and a region where the metal silicide film is not formed, and
   wherein the metal silicide film-formed region comprises a region spaced apart from an end region of the third electrode in the second direction and a region spaced apart from a stepped region of the third electrode in the first direction.

2. A semiconductor device according to claim 1, wherein over a surface of the second electrode there exist a region where the metal silicide film is formed and a region where the metal silicide film is not formed, the metal silicide-formed region being a region spaced apart from a boundary region between the third electrode and the second electrode in the second direction.

3. A semiconductor device according to claim 2,
   wherein a first plug coupled electrically to the third electrode is formed in a region of the third electrode where the third electrode does not overlap the second electrode planarly,
   wherein a second plug coupled electrically to the second electrode is formed in a region of the second electrode where the second electrode does not overlap the third electrode planarly, and
   wherein a third plug coupled electrically to the first electrode is formed over the semiconductor substrate.

4. A semiconductor device according to claim 3, wherein the first capacitor element and the second capacitor element are coupled in parallel with each other.

* * * * *